(12) United States Patent
Westwood

(10) Patent No.: US 6,724,581 B2
(45) Date of Patent: Apr. 20, 2004

(54) HIGH MOMENT IRON NITRIDE BASED MAGNETIC HEAD LAYERS RESISTANT TO HARD AXIS ANNEALING

(75) Inventor: John David Westwood, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 10/100,302

(22) Filed: Mar. 16, 2002

(65) Prior Publication Data

US 2002/0131202 A1 Sep. 19, 2002

Related U.S. Application Data

(62) Division of application No. 09/464,931, filed on Dec. 16, 1999, now Pat. No. 6,425,989.

(51) Int. Cl.[7] ............................................. G11B 5/127
(52) U.S. Cl. ....................................................... 360/317
(58) Field of Search ................................. 360/317, 318, 360/126, 315, 319, 97.01, 327.22; 148/108; 428/692; 204/192.2

(56) References Cited

U.S. PATENT DOCUMENTS

| 5,208,715 | A | * | 5/1993 | Mowry ........................ 360/319 |
| 5,264,981 | A | * | 11/1993 | Campbell et al. ............ 360/126 |
| 5,473,492 | A | | 12/1995 | Terunuma et al. .......... 360/319 |
| 5,706,151 | A | * | 1/1998 | Smith ......................... 360/315 |
| 5,731,936 | A | * | 3/1998 | Lee et al. .............. 360/327.22 |
| 6,087,026 | A | * | 7/2000 | Kakehi et al. .............. 428/692 |
| 6,125,010 | A | * | 9/2000 | Keel et al. ................... 360/126 |
| 6,169,646 | B1 | * | 1/2001 | Macken et al. ............. 360/319 |
| 6,224,719 | B1 | * | 5/2001 | Westwood ............... 204/192.2 |
| 6,267,824 | B1 | * | 7/2001 | Ishiwata et al. ............ 148/108 |
| 6,278,590 | B1 | * | 8/2001 | Gill et al. .................... 360/317 |
| 6,342,990 | B1 | * | 1/2002 | Sasaki ........................ 360/126 |
| 6,473,263 | B2 | * | 10/2002 | Jang et al. ............... 360/97.01 |
| 6,477,018 | B1 | * | 11/2002 | Terunuma ................... 360/317 |

* cited by examiner

Primary Examiner—Tianjie Chen
(74) Attorney, Agent, or Firm—Ervin F. Johnston

(57) ABSTRACT

A method employs an RF magnetron sputtering system under specific process conditions for making shield and pole piece ferromagnetic layers of a read write magnetic head wherein the magnetic anisotropy $H_K$ of the ferromagnetic layers is substantially maintained without easy axes switching when annealed along their hard axes in the presence of a magnetic field (hard axis annealing).

20 Claims, 14 Drawing Sheets

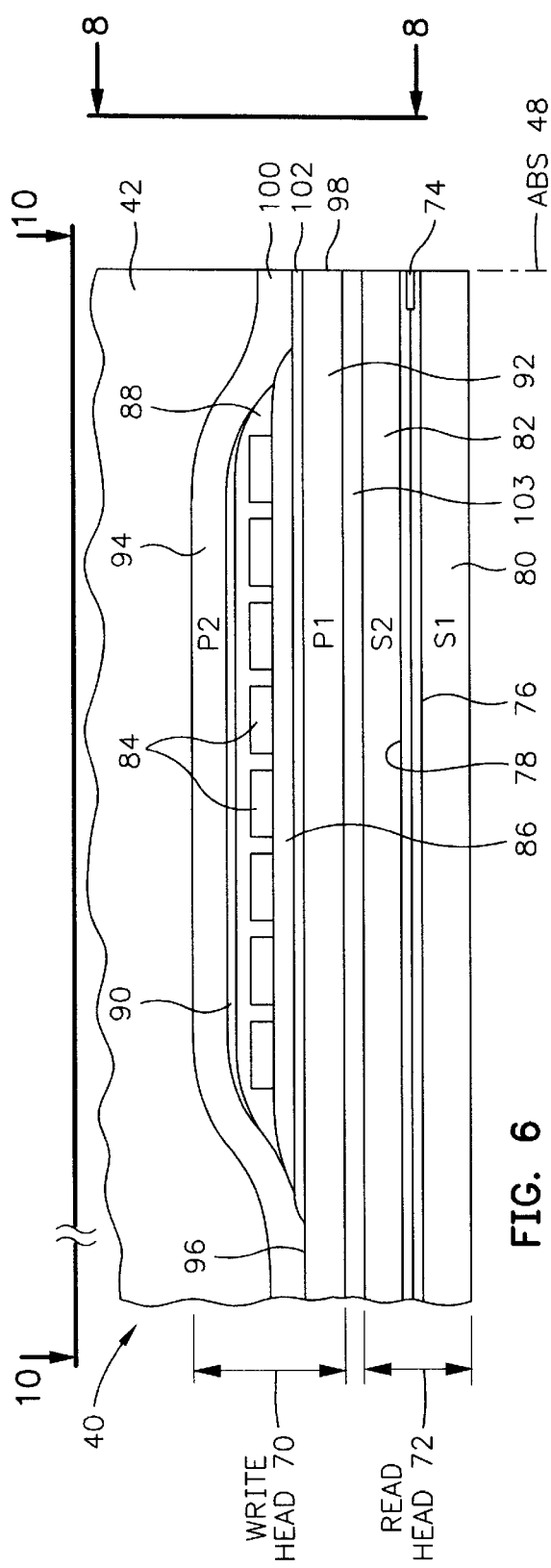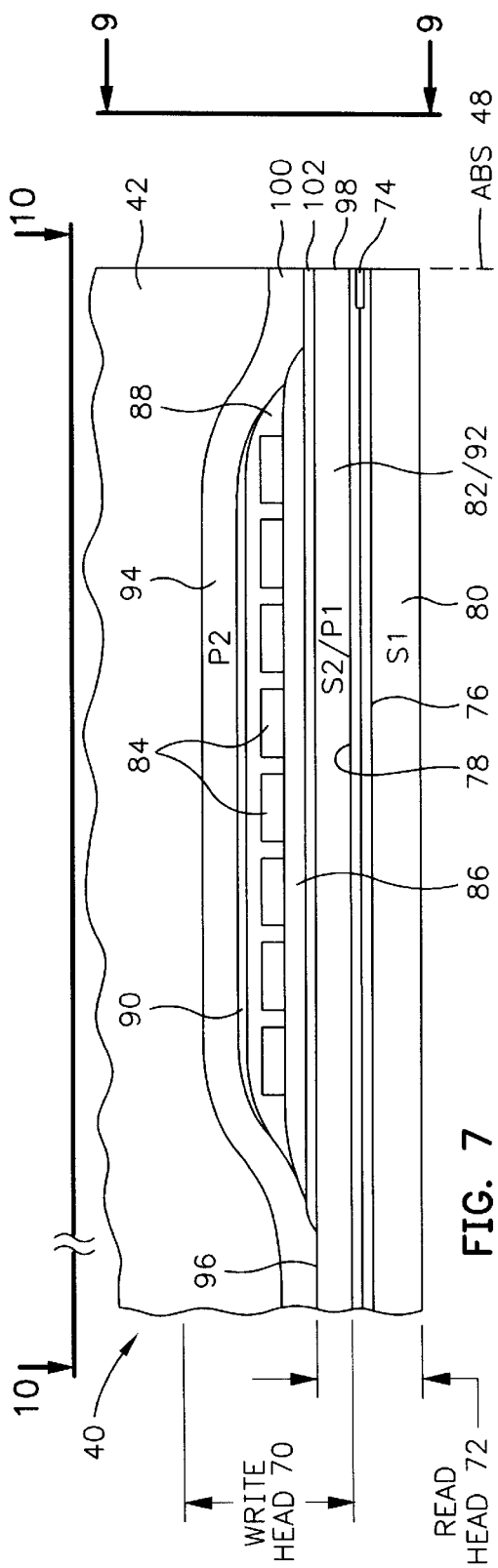

(ABS)

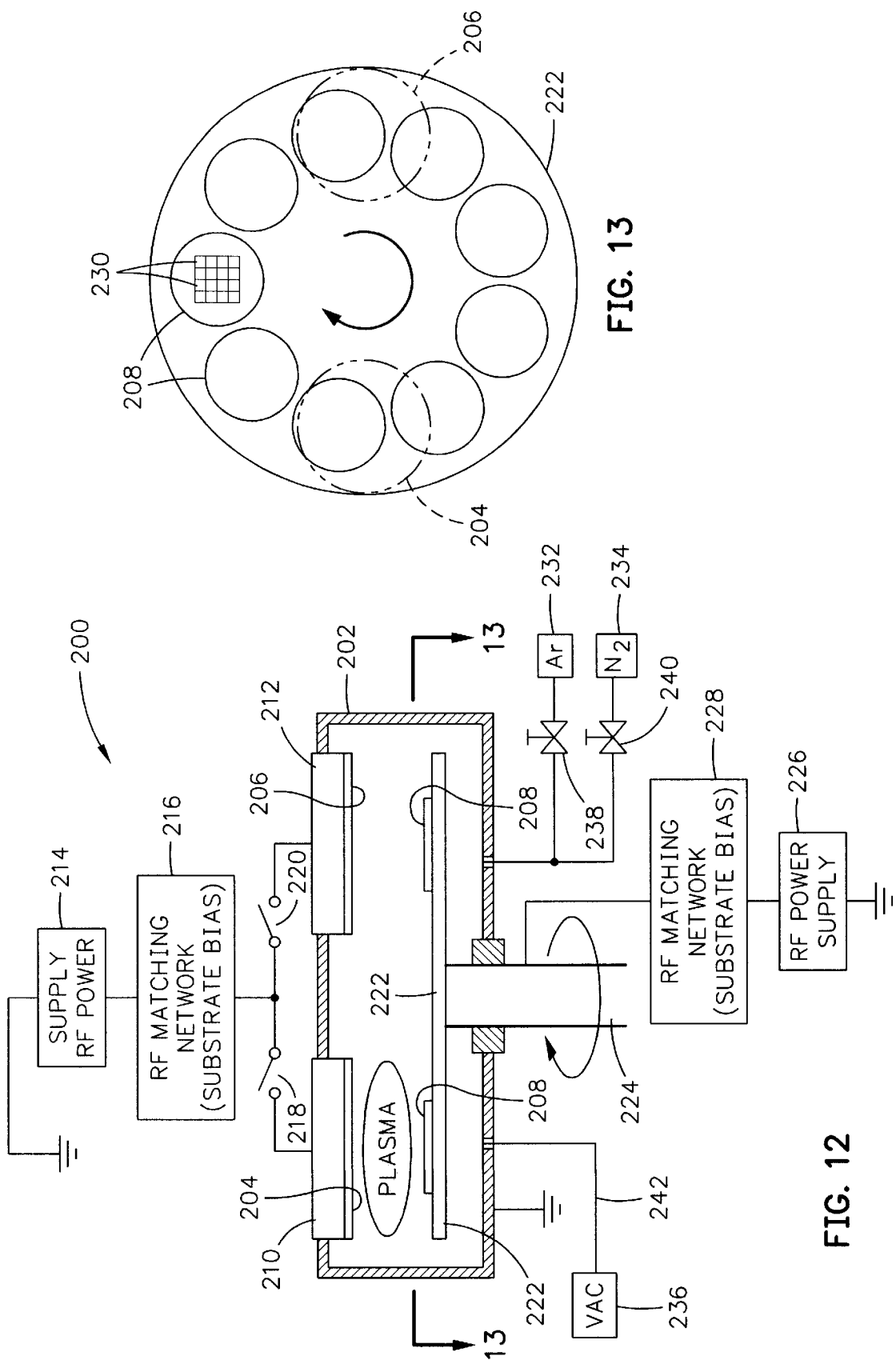

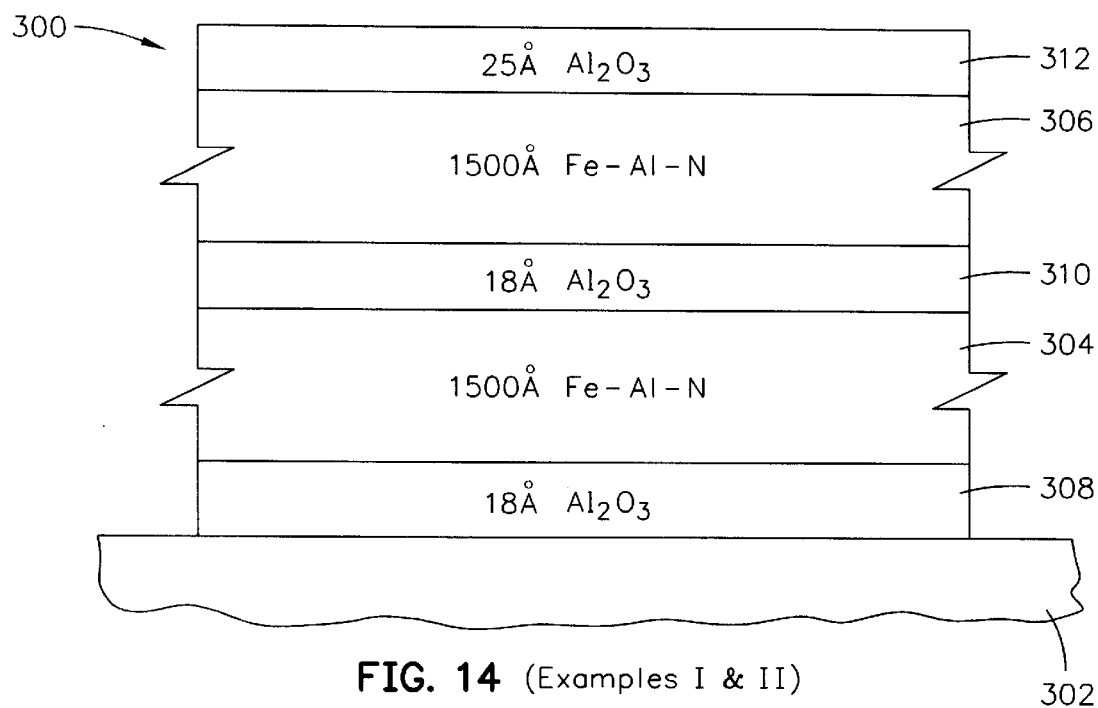
FIG. 14 (Examples I & II)
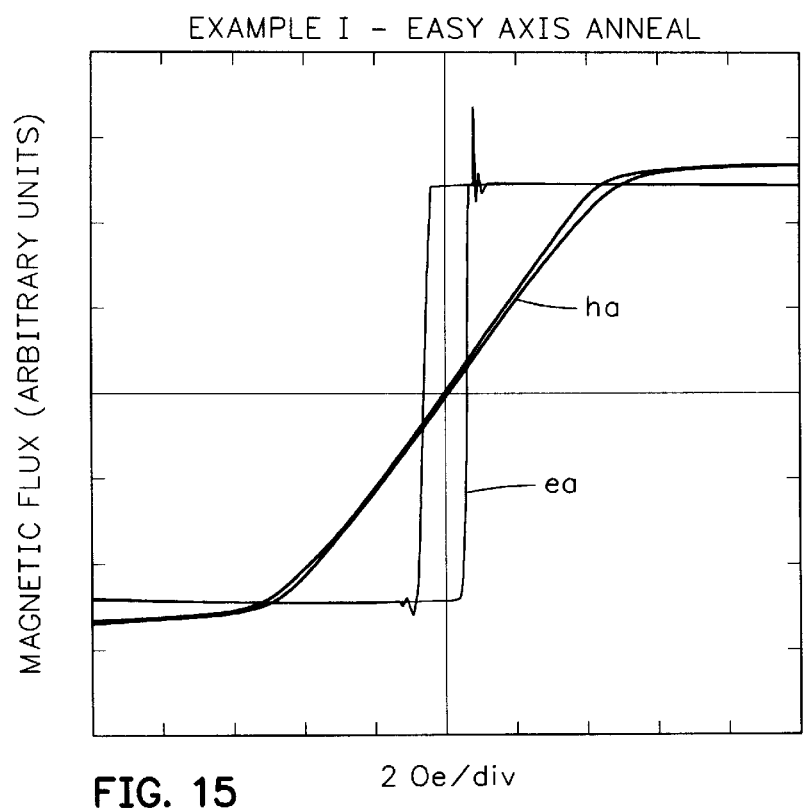
FIG. 15

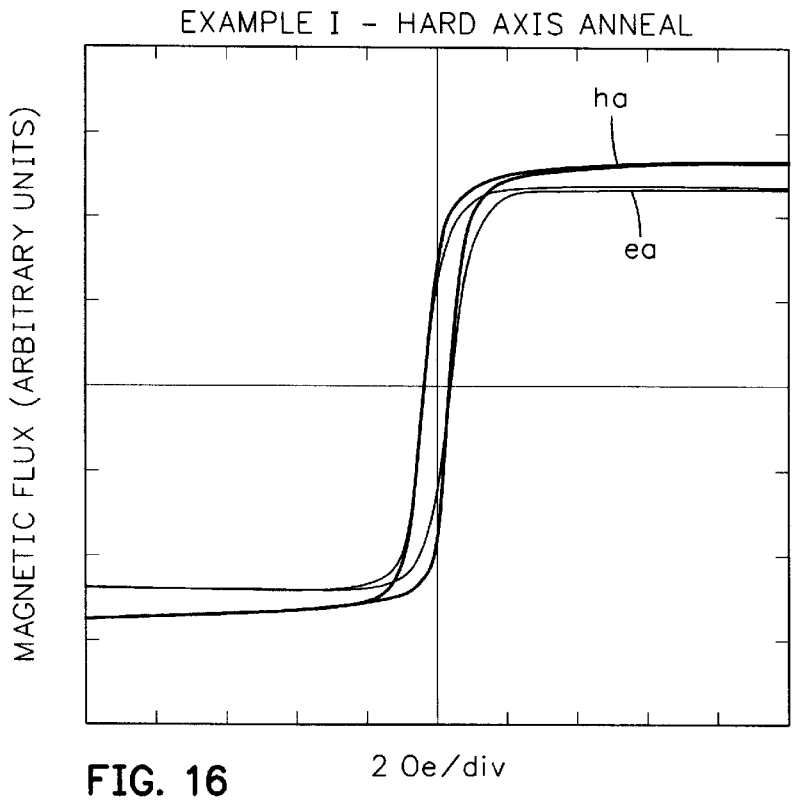
FIG. 16   2 Oe/div
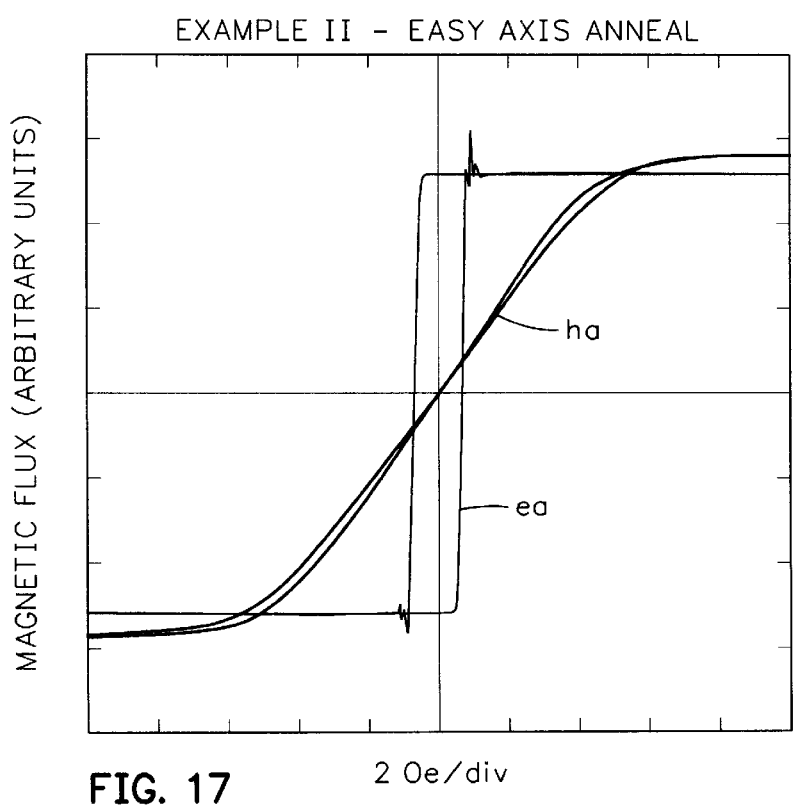
FIG. 17   2 Oe/div

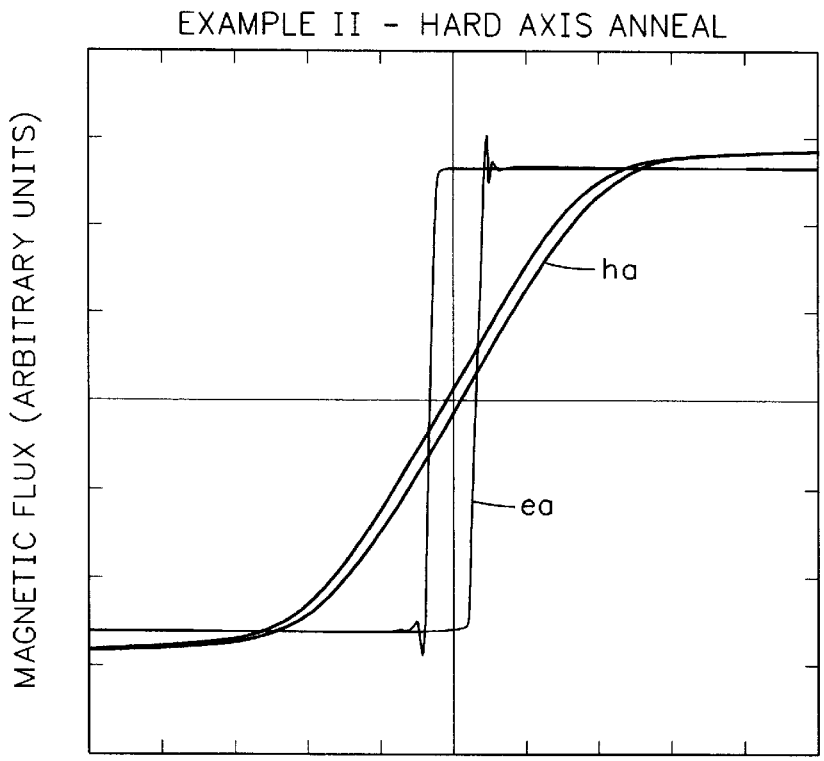
FIG. 18
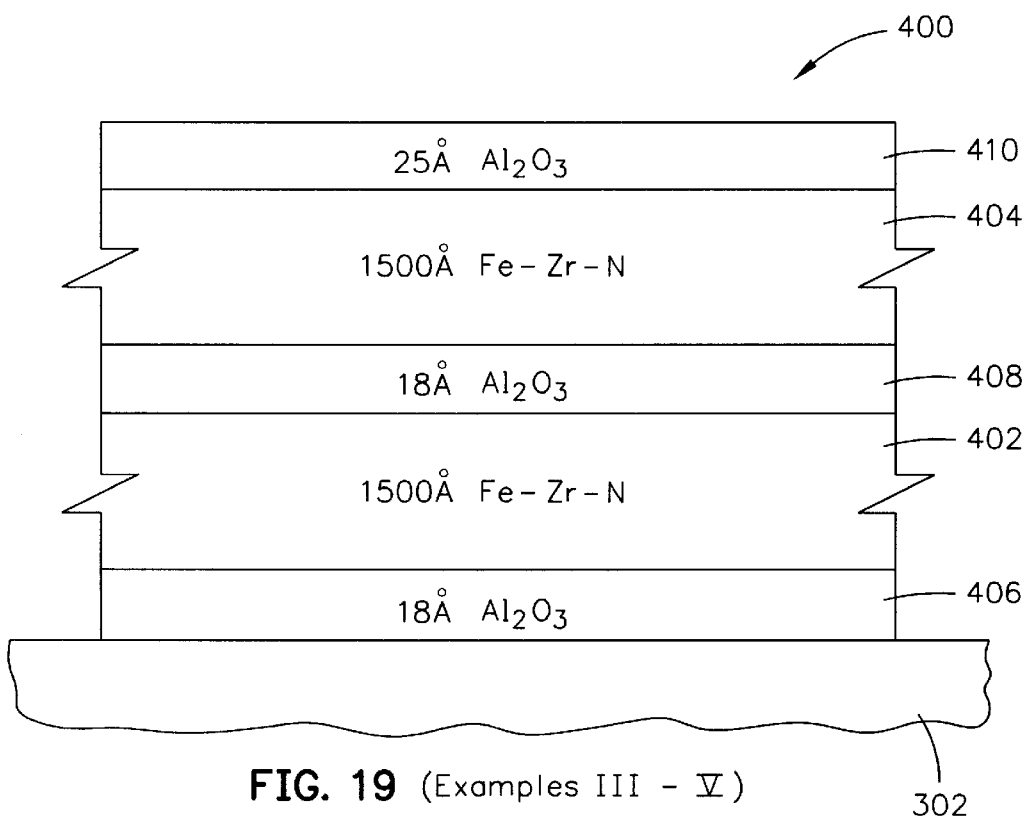
FIG. 19 (Examples III - V)

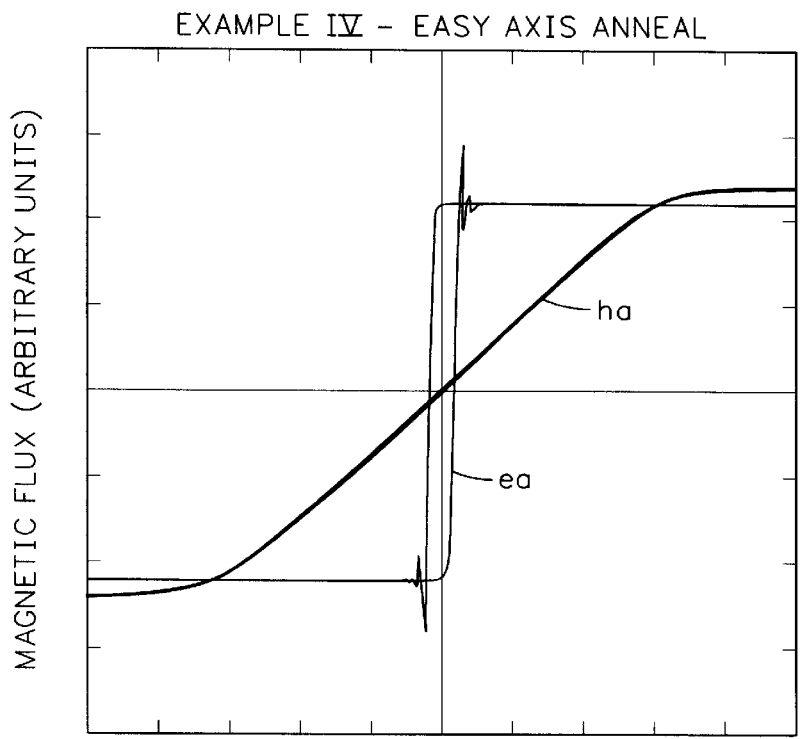
FIG. 22  EXAMPLE IV – EASY AXIS ANNEAL  2 Oe/div
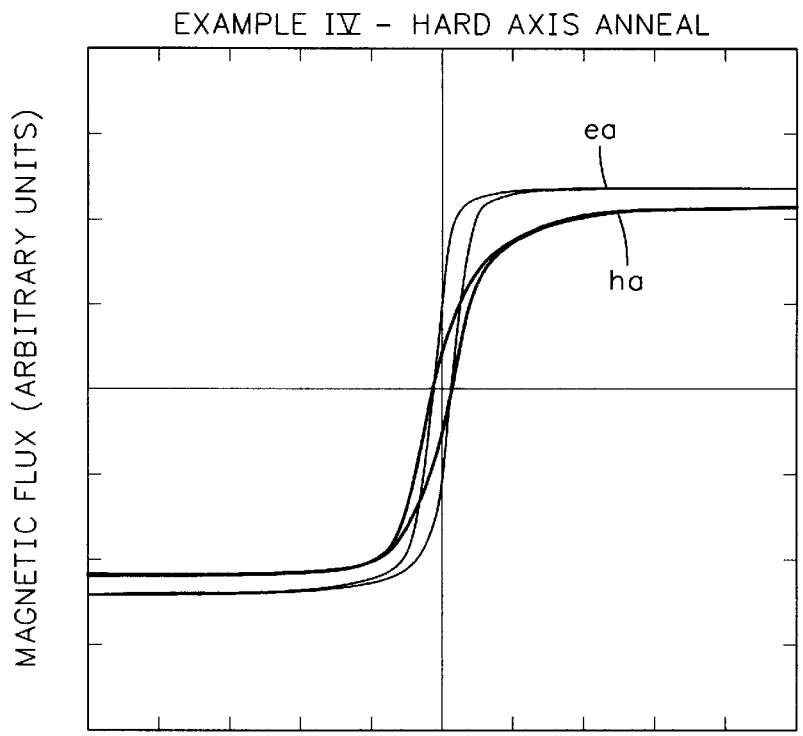
FIG. 23  EXAMPLE IV – HARD AXIS ANNEAL  2 Oe/div

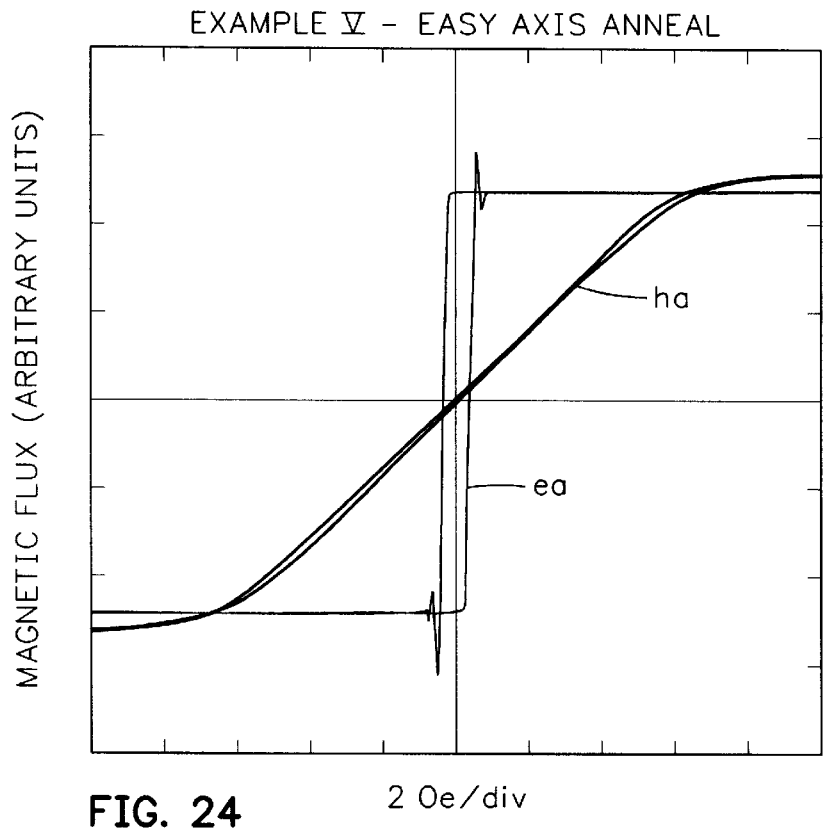
FIG. 24  EXAMPLE V – EASY AXIS ANNEAL  2 Oe/div
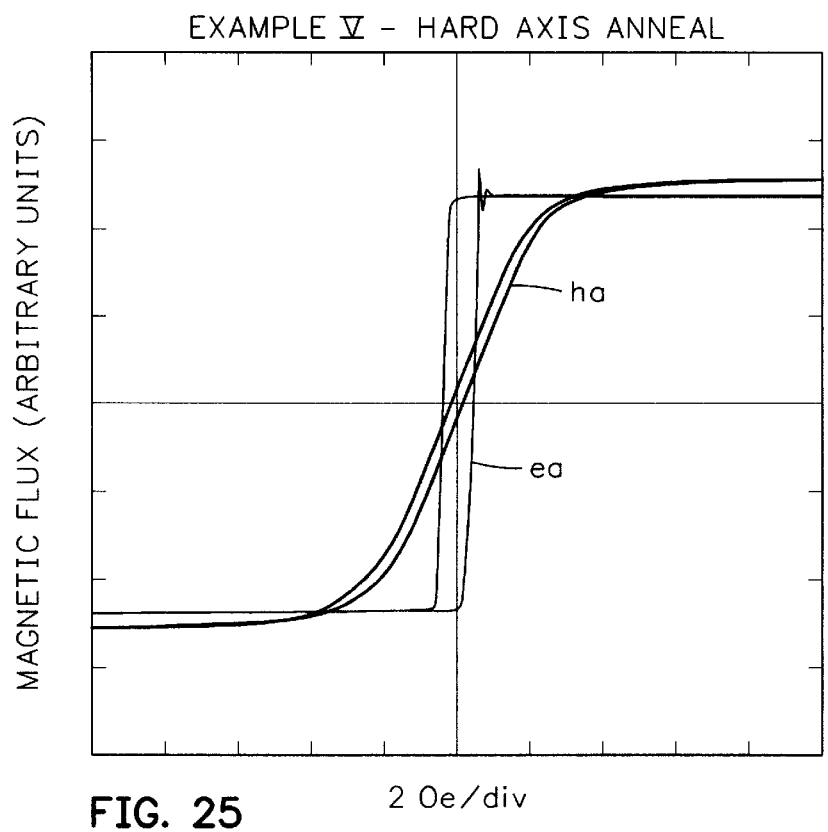
FIG. 25  EXAMPLE V – HARD AXIS ANNEAL  2 Oe/div

HIGH MOMENT IRON NITRIDE BASED MAGNETIC HEAD LAYERS RESISTANT TO HARD AXIS ANNEALING

REFERENCE TO RELATED APPLICATION

This is a divisional application of application Ser. No. 09/464,931 filed Dec. 16, 1999, now U.S. Pat. No. 6,425,989.

BACKGROUND OF THE INVENTION

1. Field of the Invention

The present invention relates to high moment iron nitride Fe—N based magnetic head layers or thin films that are resistant to hard axis annealing and more particularly to ferromagnetic shield and/or pole piece layers or thin films wherein loss of magnetic anisotropy upon annealing in the presence of a field directed along the hard axis of these layers or films is minimized.

2. Description of the Related Art

The heart of a computer is an assembly that is referred to as a magnetic disk drive. The magnetic disk drive includes a rotating magnetic disk, a slider that has read and write heads, a suspension arm above the rotating disk and an actuator that swings the suspension arm to place the read and write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a nonmagnetic gap layer at an air bearing surface (ABS) of the write head. The pole piece layers are connected at a back gap. Current conducted to the coil layer induces a magnetic field into the pole pieces that fringes across the gap between the pole pieces at the ABS. The fringe field writes information in the form of magnetic impressions in circular tracks on the rotating disk.

An exemplary high performance read head employs a spin valve sensor for sensing magnetic signal fields from the rotating magnetic disk. The spin valve sensor is located between nonmagnetic nonconductive first and second read gap layers and the first and second read gap layers are located between ferromagnetic first and second shield layers. The second shield layer may also serve as the first pole piece layer for the write head or may be a separate layer that is separated from the first pole piece layer by a nonmagnetic separation layer. In the latter case the read write head is referred to as a piggyback head. When the second shield and first pole piece are a common layer the magnetic head is referred to as a merged head. The sensor includes a nonmagnetic electrically conductive first spacer layer sandwiched between a ferromagnetic pinned layer and a ferromagnetic free layer. An antiferromagnetic pinning layer interfaces the pinned layer for pinning the magnetic moment of the pinned layer 90° to an air bearing surface (ABS) which is an exposed surface of the sensor that faces the rotating disk. First and second leads are connected to the spin valve sensor for conducting a sense current therethrough. A magnetic moment of the free layer is free to rotate upwardly and downwardly with respect to the ABS from a quiescent or zero bias point position in response to positive and negative magnetic signal fields from the rotating magnetic disk. The quiescent position of the magnetic moment of the free layer, which is preferably parallel to the ABS, is when the sense current is conducted through the sensor without magnetic field signals from the rotating magnetic disk. If the quiescent position of the magnetic moment is not parallel to the ABS the positive and negative responses of the free layer will not be equal which results in read signal asymmetry which is discussed in more detail hereinbelow.

A typical sequence of steps in the fabrication of the above read write head is to form the first shield layer (S1) by sputter deposition on a slider substrate wafer, sputter deposit the read gap layer on the first shield layer, sputter deposit the sensor, which includes the free, pinned and pinning layers, on the first read gap layer, sputter deposit hard bias and lead layers connected to the sensor, sputter deposit the second read gap layer on the sensor and the hard bias and lead layers, plate a second shield/first pole piece layer (S2/P1) on the second read gap layer if the head is a merged head, sputter deposit the write gap layer on the second shield/first pole piece layer in the pole tip region, form a first insulation layer (I1) on the second shield/first pole piece layer (S2/P1) in a yoke region by photopatterning a first layer of photoresist followed by hardbaking the photoresist at a temperature of 232° C. for 400 minutes, plate the write coil layer on the first insulation layer, form the second insulation layer (I2) on the coil layer by photopatterning a photoresist layer in the yoke region and hardbaking it at 232° C. for 400 minutes, frame plate a second pole piece layer (P2) on the write gap layer and the second insulation layer (I2), and connect it to the second shield/first pole piece layer (S2/P1) in a back gap region, anneal a second pole piece layer (P2) at 232° C. for 400 minutes, plate copper straps and studs, deposit and lap alumina overcoat, plate gold electrical connection pads, and perform a GMR reset anneal at 220° for 5 minutes. A subset of the steps which are critical in determining the magnetic properties of the shield and pole layers is shown in the following Chart A along with magnetic fields employed in each step.

CHART A

| Process Step | Magnetic Field Orientation in Annealing Steps GMR Wafer Process |
|---|---|
| S1 Deposition and Anneal | Longitudinal (easy axis) |
| Sensor Deposition | |
| Sensor Anneal: 220° C., 5 min | Transverse (hard axis) |
| S2/P1 Plating (80/20 NiFe) | |
| I1 Insulation Hardbake: 232° C., 400 min | Transverse (hard axis) |
| I2 Insulation Hardbake: 232° C., 400 min | Transverse (hard axis) |
| P2 Plating (45/55 NiFe) | |
| P2 Anneal: 232° C., 400 min | Transverse (hard axis) |
| GMR Reset: 220° C., 5 min | Transverse (hard axis) |

During formation of the various ferromagnetic layers of the read write head, each ferromagnetic layer is formed with a magnetic easy axis which is oriented parallel to the ABS by sputter depositing or plating the ferromagnetic layer in the presence of a magnetic field that is oriented parallel to the ABS. Each of these layers also has a hard axis which is 90° to the easy axis and has a magnetic anisotropy ($H_K$)

which is the amount of applied field required to rotate a magnetic moment of the ferromagnetic layer from the easy axis to the hard axis, which rotation magnetically saturates the ferromagnetic layer. It is desirable that the ferromagnetic layers have a high magnetic anisotropy for improving their performance in the magnetic read write head. After fabrication the easy axis of each of the first shield layer (S1), the second shield/first pole piece layer (S2/P1) and the second pole piece layer (P2) is oriented parallel to the ABS. It is important that subsequent processing steps not alter the easy axis orientation of the first shield layer (S1) and the second shield/first pole piece layer (S2/P1) so that a bias point of the sensor is not changed by nonparallel magnetic fields from these ferromagnetic layers. Further, it is important that the easy axis of each of the second shield/first pole piece layer (S2/P1) and the second pole piece layer (P2) be parallel to the ABS so that a write field current from the write coil rotates the magnetic moments of these free layers from the parallel position to effectively write a write signal into a track on the rotating magnetic disk.

As shown in the second column of Chart A, various field orientations are employed during various annealing steps shown in the first column of Chart A. After sputter depositing the first shield layer (S1) the wafer is annealed at a temperature of 475° C. in the presence of a magnetic field parallel to the easy axis of the first shield layer which is also parallel to the ABS. This annealing sets the easy axis of the first shield layer parallel to the ABS. After fabricating the sensor, the wafer is annealed at a temperature of 220° C. for 5 minutes in the presence of a field that is transverse to the easy axis of the first shield layer and to the ABS for the purpose of positioning a magnetic moment of the pinned layer perpendicular to the ABS which, in turn, orients magnetic spins of the pinning layer perpendicular to the ABS. When the annealing and transverse field is terminated the magnetic spins of the pinning layer pin the magnetic moment of the pinned layer perpendicular to the ABS. It should be noted that the field employed during this annealing step is along the hard axis of the first shield layer (S1) which is noted in parenthesis in the second column of Chart A. The second shield/first pole piece layer (S2/P1) is frame plated in the presence of a field that is oriented parallel to the ABS for setting its easy axis in that direction. During hardbaking of the first and second insulation layers (I1 and I2) a magnetic field of approximately 1000 Oe is employed transverse to the easy axes of S1 and S2/P1 for maintaining an exchange coupling field between the pinning and pinned layers of the sensor so that the magnetic moment of the pinned layer will be strongly pinned in the transverse direction. The fields during the hardbake of the insulation layers are directed along the hard axes of the first shield layer (S1) and the second shield/first pole piece layer (S2/P1). After plating the second pole piece layer (P2) the second pole piece layer is annealed at a temperature of 232° C. for 400 minutes in the presence of a field which is transverse to the easy axes of S1, S2/P1 and P2 for the purpose of relaxing the stress in the second pole piece layer (P2). This field is directed along the hard axes of the first shield layer (S1), the second shield/first pole piece layer (S2/P1) and the second pole piece layer (P2). Finally, the magnetic spins of the pinning layer are reset at a temperature of 220° C. for 5 minutes in the presence of a field that is directed transverse to the ABS and along the hard axes of the first shield layer (S1), the second shield/first pole piece (S2/P1) and the second pole piece layer (P2).

For GMR heads, transverse annealing is needed for optimal sensor performance, but this hard axis annealing may well have an adverse effect on the magnetic anisotropy and easy axis orientation of the shields and poles. In the plated 80/20 NiFe films used in the current process, for example, a single insulation hardbake on the hard axis nearly destroys the magnetic anisotropy, and the GMR reset process by itself causes significant degradation.

In the future, the use of high moment Fe-based films is highly desirable in the write head because (1) high moment is required to write at high density on high coercivity disks; and (2) favorable domain configurations and eddy current reduction for high frequency writing can be obtained in laminations with an insulating material. High Fe contents films are also attractive as shields because: (1) the thermal conductivity is comparable to the NiFe, which is advantageous for heat dissipation; and (2) high moment ($4\pi M_s$=20 kG) makes the shield less susceptible than, for example, 80/20 NiFe (10 kG) or Sendust (9 kG) to the effects of stress induced anisotropy on easy axis orientation (i.e., the intrinsic anisotropy energy $1/2H_K M_S$ is higher relative to the stress induced anisotropy energy $3/2\lambda_s \sigma$). The favorable performance of Fe-based films as either poles or shields depends on controlling the easy axis orientation and domain structure in the films. We have observed, however, that Fe-N/alumina laminates, with structures such as (25 Å alumina/500 Å Fe—N)$_{6x}$/25 Å alumina=3175 Å or (18 Å alumina/1500 Fe—N)$_{2x}$/25 Å alumina=3061 Å do no retain magnetic anisotropy when subjected to hard axis annealing. Similar to 80/20 NiFe, a single hardbake at 232° C., 400 min causes the films to become nearly isotropic or even switch easy axis directions. Domain imaging by Kerr microscopy confirms that hard axis annealed Fe—N/alumina laminates develop undesirable domain structures for either pole or shield applications.

Adding a metal M (M=Ti, Zr, Hf, Nb, Ta, B, Al, Si, etc.) to Fe—N is known to increase thermal stability. Viala et al. (*J. Appl. Phys.* 81 (1997) 4498) report, however, that the easy axis orientation in Fe$_{94.2}$Ta$_{3.3}$N$_{2.5}$ (at %) films deposited by DC magnetron sputtering rotates to the original hard axis direction after a 60 min hard axis anneal at 150° C. These same films are stable under easy axis annealing up to 300° C.

U.S. Pat. No. 5,473,492 (TDK, 1995 "Magnetic Head Including a Reproducing Head Utilizing a Magneto resistance Effect and Having a Magnetic Shielding Film Containing Nitrogen") describes use of Fe—M$_x$—N$_y$ (0.1<x<25, 0.1<y<25 (atomic %)) as S1 and/or S2/P1. The teaching in this patent does not address the issue of hard axis annealing, most likely because in 1995, the annealing requirements for GMR sensors were not understood. On the subject of processing conditions, the patent states (col. 4, 32–35): "The sputtering mode is not critical and the sputtering apparatus used is not limited and may be a conventional one. The operating pressure is usually about 0.1 Pa to about 10 Pa. Sputtering conditions including input voltage may be suitably determined in accordance with the sputtering mode." This patent clearly teaches that sputtering method and conditions are not critical for achieving soft properties in these films. While the sputtering conditions are less critical for some methods (e.g., RF magnetron and RF diode) than others (DC magnetron), this teaching is consistent with other literature and patents, which assume that the films will be annealed with a magnetic field along the easy axis.

The work of Viala et al. shows that film properties and stability after easy axis annealing cannot be used to predict the stability in a hard axis anneal. Viala concludes "The instability of interstitial N atoms, which are believed to control the magnetic anisotropy in these films, may be a cause for concern in device applications of this class of materials". Loss of magnetic anisotropy and easy axis orientation in iron rich, high moment Fe—M—N films under hard axis annealing is a serious problem that compromises the usefulness of these materials in practical GMR recording heads.

SUMMARY OF THE INVENTION

Contrary to the teaching in the literature, I have found that at least some Fe—M—N films and laminations of these films can be fabricated which retain their magnetic anisotropy and easy axis orientation after the hard axis annealing conditions encountered in the GMR wafer process. Contrary to the teaching in U.S. Pat. No. 5,473,492, the sputtering conditions play a critical role in determining the ability of the film to withstand hard axis annealing.

I have provided a method of making at least one of the first shield layer (S1), the second shield/first pole piece layer (S2/P1) and the second pole piece layer (P2) which improves the properties of these layers so that upon hard axis annealing (annealing in the presence of a magnetic field directed along the hard axis of these layers) the loss of magnetic anisotropy is significantly less than such layers made by prior art processes. My method of making is preferably practiced with an RF magnetron sputtering system wherein the system includes a sputtering chamber, a wafer substrate in the chamber where the layers are to be formed, a magnetron cathode assembly in the chamber which includes a target of a selected material to be sputtered and a magnetron array behind the target with the target located between the magnetron array and the substrate, a first power supply for applying power with an RF component to the target, a second power supply for applying an RF substrate bias to the wafer substrate and a gas supply and means for supplying controlled mixtures of selected gases to the chamber under a specified pressure. The steps of making one of the ferromagnetic layers includes providing a selected material for the cathode target that is iron (Fe) based, employing the second power supply source to apply an RF substrate bias from 0 to −15 volts to the wafer substrate, employing the gas supply and chamber pressure control to supply selected gases to the chamber with a pressure from $4.0 \times 10^{-3}$ to $8.0 \times 10^{-3}$ mbar with at least one of the selected gases being nitrogen ($N_2$) and sputter depositing the selected material to form on the wafer substrate the ferromagnetic layer with an iron nitride (Fe—N) based material composition. Preferred alloy additions in Fe—M—N films are aluminum (Al) or zirconium (Zr). The substrate bias is preferably in a range from −5 to −12 volts and a partial pressure of the nitrogen ($N_2$) may be from $0.10 \times 10^{-3}$ to $0.40 \times 10^{-3}$ mbar. In still a further preferred embodiment magnetron sputtering is employed for sputter depositing multiple films of selected materials onto the substrate to form at least one of the ferromagnetic layers into a laminated layer of alternating iron nitride (Fe—N) based and alumina films. In the preferred embodiment the above process conditions of the RF magnetron sputtering system are adjusted such that after hard axis annealing, the magnetic anisotropy $H_K$ of the ferromagnetic layer is at least 2.0 Oe and that a ratio of hard axis to easy axis coercivity is less than or equal to 0.60.

An object of the present invention is to provide a method of making a ferromagnetic layer of a read write head which has a minimal loss of magnetic anisotropy upon hard axis annealing.

Another object is to provide a method of making a ferromagnetic layer of a read write head which has a magnetic anisotropy of at least 2.0 Oe and a hard axis to easy axis coercivity ratio of less than or equal to 0.60 after hard axis annealing.

A further object is to employ the above processes for making a microstructurally different ferromagnetic layer in a read write head which has minimal loss of magnetic anisotropy after hard axis annealing.

Other objects and advantages of the invention will become apparent upon reading the following description taken together with the accompanying drawings.

BRIEF DESCRIPTION OF THE DRAWINGS

FIG. 6 is a partial view of the slider and a piggyback magnetic head as seen in plane 6—6 of FIG. 2;

FIG. 7 is a partial view of the slider and a merged magnetic head as seen in plane 7—7 of FIG. 2;

FIG. 12 is a side schematic illustration of an exemplary RF magnetron sputtering system;

FIG. 13 is a view taken along plane 13—13 of FIG. 12;

FIG. 14 is a cross-section of a laminated ferromagnetic first shield layer (S1), laminated second shield/first pole piece layer (S2/P1) or laminated second pole piece layer (P2) of the read write head for Examples I and II;

FIG. 15 is a magnetic flux versus applied field H in oersteds (B/H) graph of Example I after easy axis annealing;

FIG. 16 is an B/H graph of Example I after hard axis annealing;

FIG. 17 is an B/H graph of Example II after easy axis annealing;

FIG. 18 is an B/H graph of Example II after hard axis annealing;

FIG. 19 is a cross-section of a laminated first shield layer (S1), laminated second shield/first pole piece layer (S2/P1) or laminated second pole piece layer (P2) for Examples III, IV and V;

FIG. 22 is an B/H graph of Example IV after easy axis annealing;

FIG. 23 is an B/H graph of Example IV after hard axis annealing;

FIG. 24 is an B/H graph of Example V after easy axis annealing;

FIG. 25 is an B/H graph of Example V after hard axis annealing;

DESCRIPTION OF THE PREFERRED EMBODIMENTS

Magnetic Disk Drive

Figure 1:
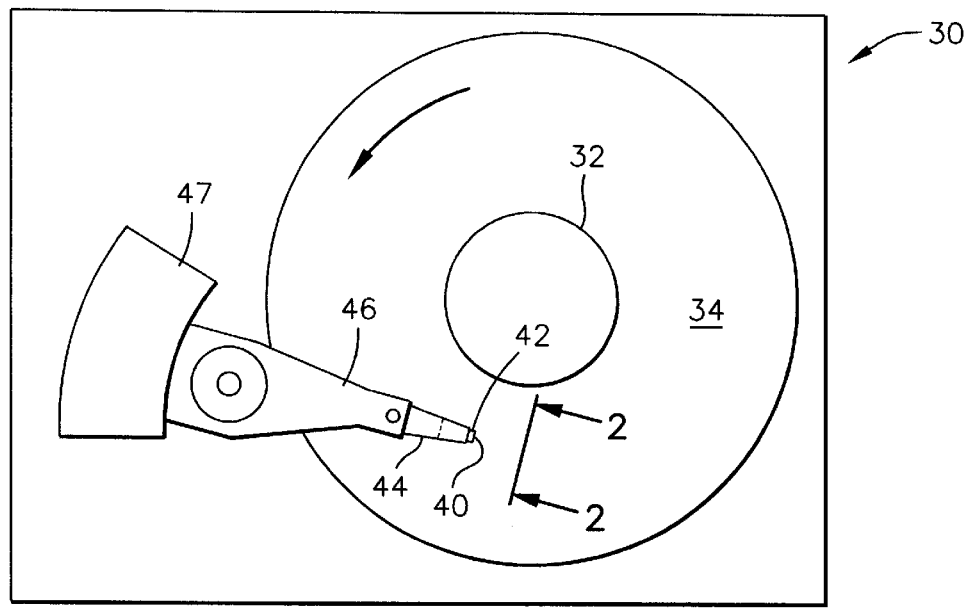
FIG. 1 is a plan view of an exemplary magnetic disk drive.
Figure 2:
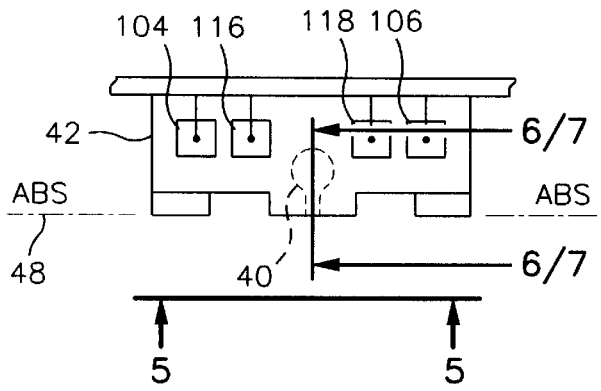
FIG. 2 is an end view of a slider with a magnetic head of the disk drive as seen in plane 2—2.
Figure 3:
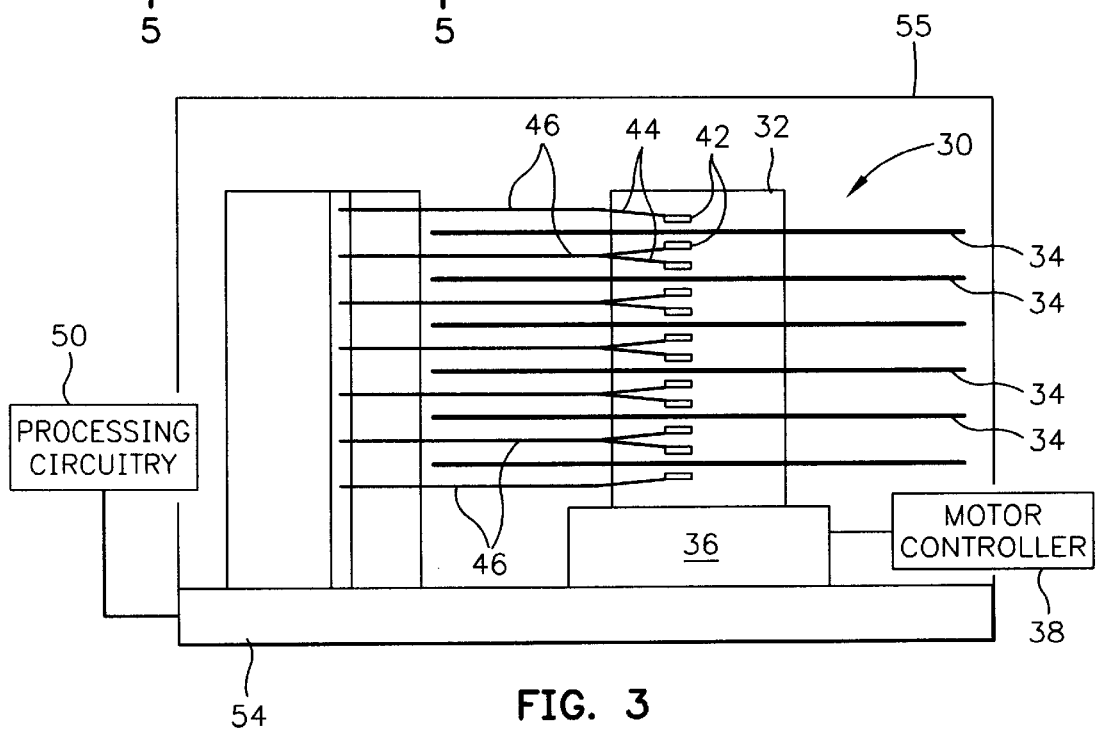
FIG. 3 is an elevation view of the magnetic disk drive wherein multiple disks and magnetic heads are employed.
Figure 4:
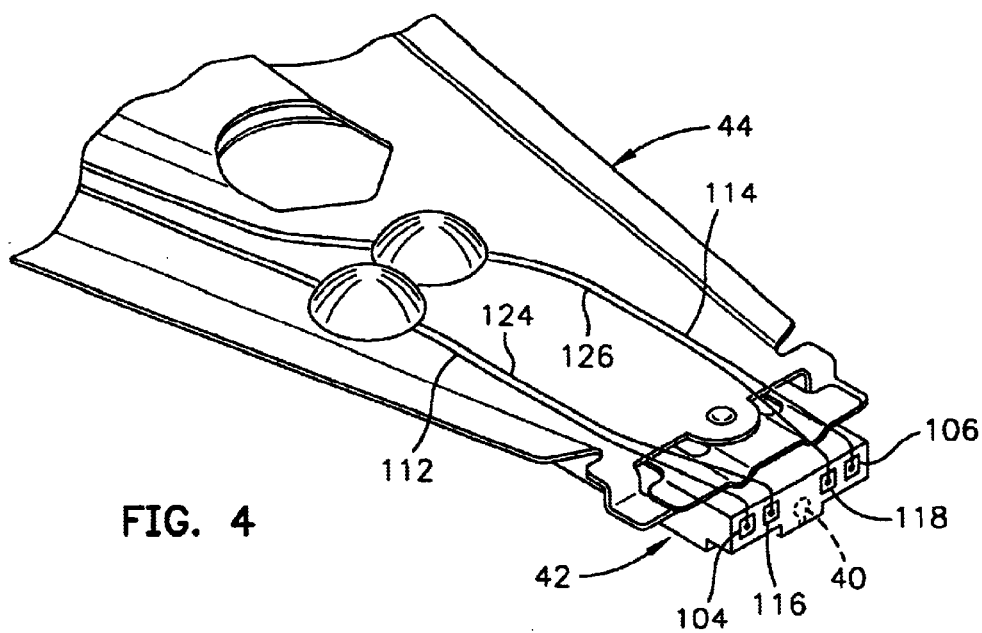
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a spindle motor 36 that is controlled by a motor controller 38. A slider 42 has a combined read and write magnetic head 40 and is supported by a suspension 44 and actuator arm 46 that is rotatably positioned by an actuator 47. A plurality of disks, sliders and suspensions may be employed in a large capacity direct access storage device (DASD) as shown in FIG. 3. The suspension 44 and actuator arm 46 are moved by the actuator 47 to position the slider 42 so that the magnetic head 40 is in a transducing relationship with a surface of the magnetic disk 34. When the disk 34 is rotated by the spindle motor 36 the slider is supported on a thin (typically, 0.05 μm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides spindle motor drive signals for rotating the magnetic disk 34, and provides control signals to the actuator for moving the slider to various tracks. In FIG. 4 the slider 42 is shown mounted to a suspension 44. The components described hereinabove may be mounted on a frame 54 of a housing, as shown in FIG. 3.

Figure 5:
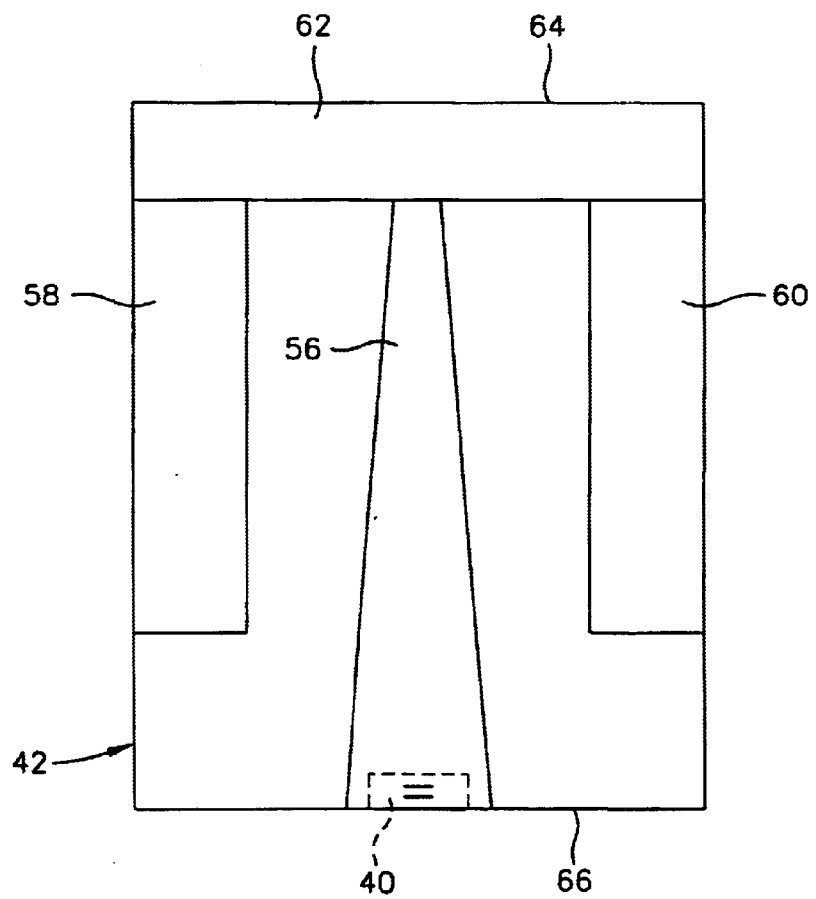
FIG. 5 is an ABS view of the magnetic head taken along plane 5—5 of FIG. 2.
Figure 10:
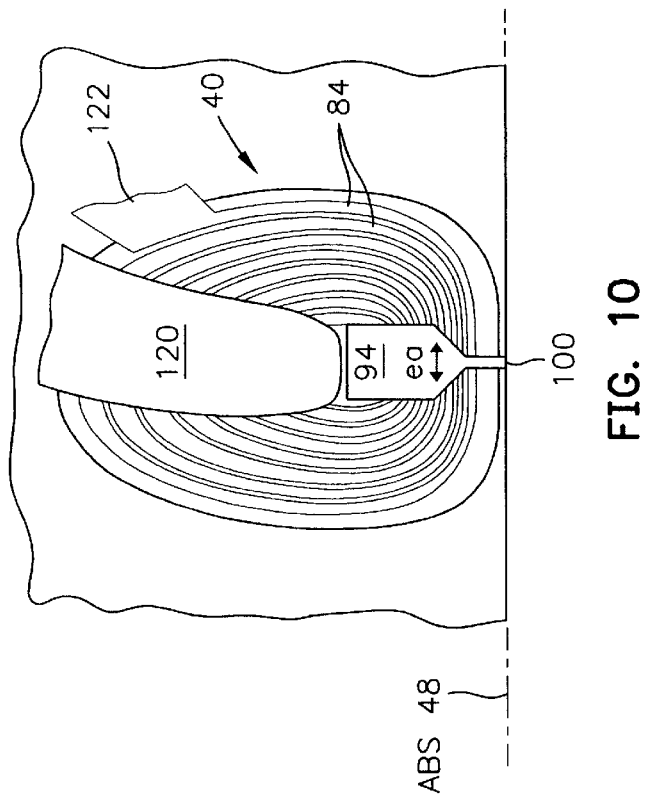
FIG. 10 is a view taken along plane 10—10 of FIG. 6 or 7 with all material above the coil layer and leads removed.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 8:
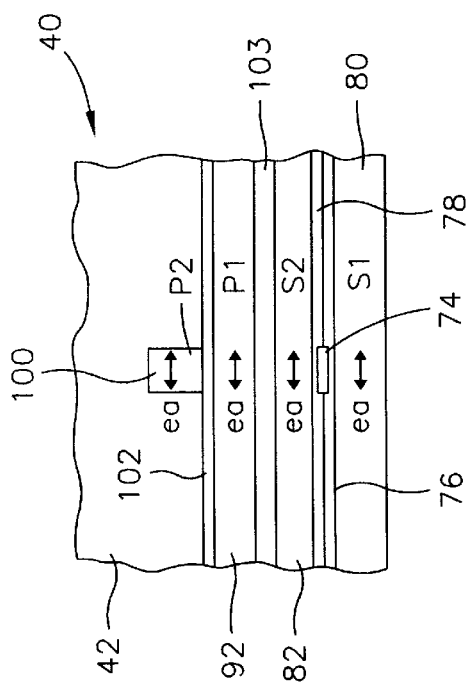
FIG. 8 is a partial ABS view of the slider taken along plane 8—8 of FIG. 6 to show the read and write elements of the piggyback magnetic head.

FIG. 6 is a side cross-sectional elevation view of a piggyback magnetic head 40, which includes a write head portion 70 and a read head portion 72, the read head portion employing a spin valve sensor 74 of the present invention. FIG. 8 is an ABS view of FIG. 6. The spin valve sensor 74 is sandwiched between nonmagnetic electrically insulative first and second read gap layers 76 and 78, and the read gap layers are sandwiched between ferromagnetic first and second shield layers 80 and 82. In response to external magnetic fields, the resistance of the spin valve sensor 74 changes. A sense current Is conducted through the sensor causes these resistance changes to be manifested as potential changes. These potential changes are then processed as readback signals by the processing circuitry 50 shown in FIG. 3.

The write head portion 70 of the magnetic head 40 includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. An insulation layer 103 is located between the second shield layer 82 and the first pole piece layer 92. Since the second shield layer 82 and the first pole piece layer 92 are separate layers this head is known as a piggyback head. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 8) to leads 124 and 126 on the suspension.

Figure 9:
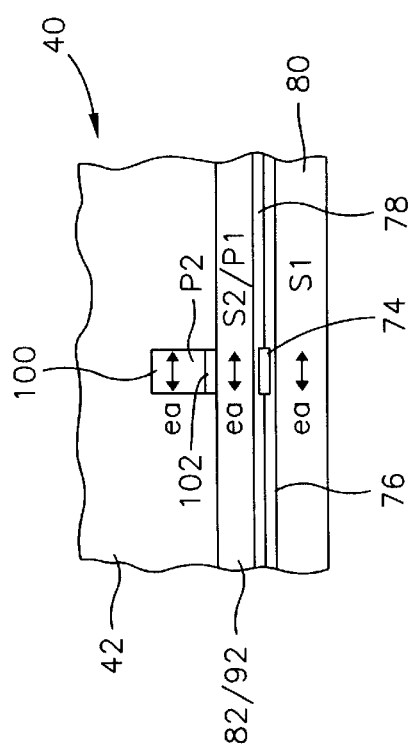
FIG. 9 is a partial ABS view of the slider taken along plane 9—9 of FIG. 7 to show the read and write elements of the merged magnetic head.

FIGS. 7 and 9 are the same as FIGS. 6 and 8 except the second shield layer 82 and the first pole piece layer 92 are a common layer. This type of head is known as a merged magnetic head. The insulation layer 103 of the piggyback head in FIGS. 6 and 8 is omitted.

Figure 11:
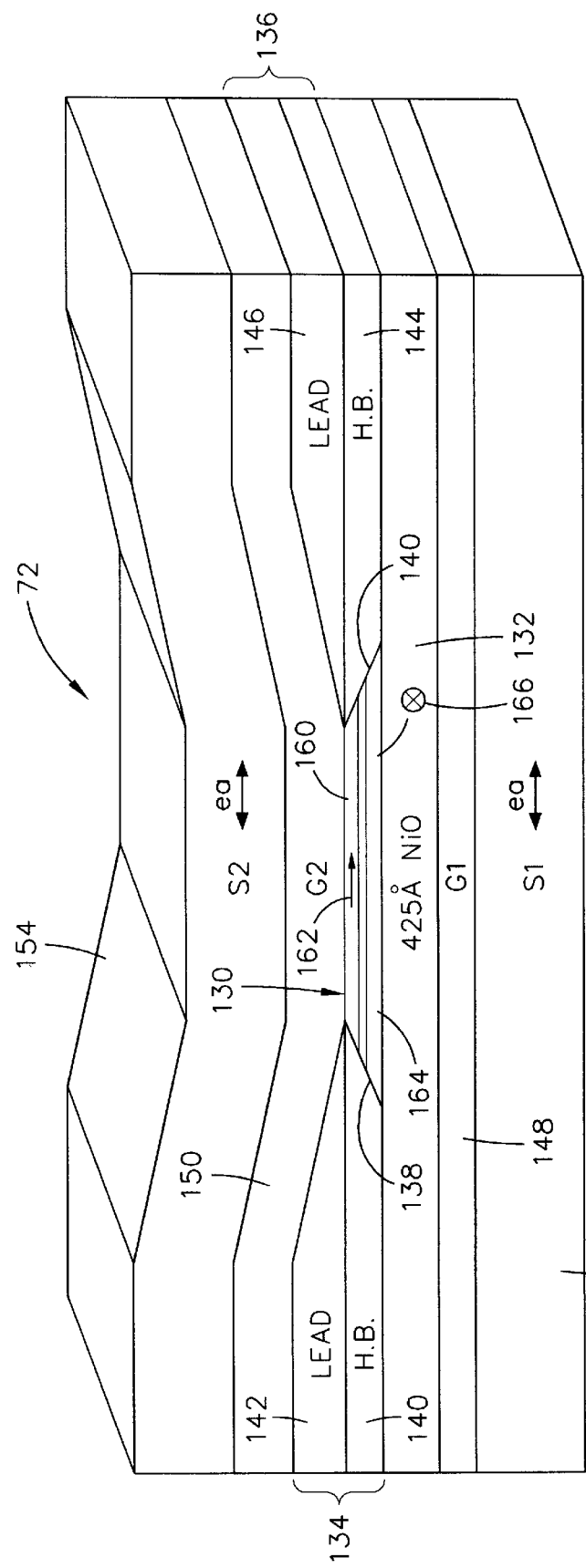
FIG. 11 is an isometric ABS illustration of a read head which employs a spin valve (SV) sensor.

FIG. 11 is an isometric ABS illustration of the read head 72 shown in FIG. 6 or 8. The read head 72 includes the present spin valve sensor 130 which is located on an antiferromagnetic (AFM) pinning layer 132. A ferromagnetic pinned layer in the spin valve sensor 130, which is to be described hereinafter, is pinned by the magnetic spins of the pinning layer 132. The AFM pinning layer may be 425 Å of nickel oxide (NiO). First and second hard bias and lead layers 134 and 136 are connected to first and second side edges 138 and 140 of the spin valve sensor. This connection is known in the art as a contiguous junction and is fully described in commonly assigned U.S. Pat. No. 5,018,037 which is incorporated by reference herein. The first hard bias and lead layers 134 include a first hard bias layer 140 and a first lead layer 142 and the second hard bias and lead layers 136 include a second hard bias layer 144 and a second lead layer 146. The hard bias layers 140 and 144 cause magnetic fields to extend longitudinally through the spin valve sensor 130 for stabilizing the magnetic domains therein. The AFM pinning layer 132, the spin valve sensor 130 and the first and second hard bias and lead layers 134 and 136 are located between nonmagnetic electrically insulative first and second read gap layers 148 and 150. The first and second read gap layers 148 and 150 are, in turn, located between ferromagnetic first and second shield layers 152 and 154.

As can be seen from FIGS. 8–11 the ferromagnetic layers S1, S2, P1, P2 and S2/P1 have easy axes (ea) which are oriented parallel to the ABS and parallel to the surface planes of the layers. As shown in FIG. 11 the sensor 130 has a free layer 160 with its magnetic moment 162 oriented parallel to the ABS and a pinned layer 164 which has a magnetic moment 166 pinned perpendicular to the ABS, either toward or away from the ABS, by the magnetic spins of the pinning layer 132. As explained hereinabove, during the various annealing steps in the process of making the read write head shown in FIGS. 8–10, a magnetic field is oriented perpendicular to the ABS during the annealing steps to preserve the exchange coupling field between the pinning layer 132 and the pinned layer 164. A loss in the exchange coupling field can cause the magnetic moment 166 of the pinning layer to reverse its direction when subjected to a high heat condition in the presence of a field such as high heat due to an electrostatic discharge (ESD) or due to impacting an asperity on the rotating magnetic disk in the presence of a reverse field from a signal field from the rotating magnetic disk. If the exchange coupling field is not higher than the coercivity of the pinned layer 164 the magnetic moment 166 of the pinned layer will not return to its original orientation. This renders the read head inoperative. Hard axis annealing (high temperature in the presence of a field along the hard axis of the ferromagnetic layers S1, S2, P1 and P2) to preserve the aforementioned exchange coupling field seriously degrades the magnetic anisotropy of these ferromagnetic layers when formed according to prior art processes.

The following Examples I, III and IV illustrate ferromagnetic layers which significantly lose their magnetic anisotropy $H_K$ when made according to certain process conditions and Examples II and V demonstrate ferromagnetic films which retain a highly desirable magnetic anisotropy $H_K$ when process conditions according to the present invention are employed.

An exemplary radio frequency (RF) sputtering system 200 is illustrated in FIGS. 12 and 13. As shown in FIG. 12 the system includes a sputtering chamber 202, first and second cathode targets 204 and 206 within the sputtering chamber, a plurality of wafer substrates 208 in the chamber where the ferromagnetic layers are to be formed, first and second magnetron cathode assemblies 210 and 212 with the targets 204 and 206 located between the magnetron arrays (not shown) inside the cathode assemblies and the wafer substrates 208, and an RF power supply 214 for applying radio frequency power to either of the magnetron cathode assemblies 210 or 212 via an RF matching network 216 and switches 218 and 220. The wafer substrates 208 are electrically connected to a conductive turntable 222 which is rotated continuously under the targets by a conductive shaft 224. An RF power supply 226 and associated matching network 228 supplies a substrate bias to the wafer substrates 208 via the shaft 224 and the turntable 222. As shown in FIG. 13, rows and columns 230 of read write magnetic heads may be fabricated on each wafer substrate 208. An argon (Ar) supply 232 and a nitrogen ($N_2$) supply 234 are connected to the sputtering chamber via mass flow controllers for introducing precisely controlled flows of argon and nitrogen gases into the chamber. Before introducing these gases the chamber is pumped to high vacuum by a vacuum pump system 236. Thereafter, mass flow controllers 238 and 240 control the flows of the gases to produce a selected mixture of the gases in the chamber. A selected pressure is maintained by the flow of gas into the chamber and evacuation of the gas from the chamber through a vacuum line 242 between the chamber and the vacuum pump system 236. Optionally, the vacuum line 242 may have an adjustable valve (not shown) for adjusting pressure. In the following five examples, the turntable 222 is continuously rotated during sputter deposition.

In Examples I and II laminated layers with the structure (18 Å alumina/1500 Å Fe—Al (approx. 2 at %)-N)$_{2x}$/25 Å alumina=3061 Å were deposited by RF magnetron sputtering in a Balzers Z660 sputtering system depicted in FIGS. 12 and 13 from a Fe—Al (2 at %) target under a variety of conditions of pressure, RF substrate bias, pressure, and % $N_2$ in the process gas. This is shown by a laminated layer 300, in FIG. 14, which is formed on the substrate 302 (208 in FIG. 12) with the first and second ferromagnetic layers 304 and 306 and the alumina layers 308, 310 and 312. One of the laminated layers 300 was formed according to one set of process conditions for Example I and another laminated layer 300 was formed according to another set of process conditions for Example II. The wafer substrates 302 were pieces of alumina-titanium carbide ($Al_2O_3$-TiC), a composite ceramic substrate used for head fabrication, which were coated with approximately 4 μm of sputtered and lapped alumina. In each of Examples I–V, a first substrate piece with a fabricated laminated layer deposited on it was annealed in an oven at 232° C. for 400 minutes with the easy axes of the ferromagnetic layers parallel to an applied field of approximately 1000 Oe. A second substrate piece from the same deposition was annealed at the same time in the oven with the hard axis of the laminated layer parallel to the field. The latter annealing simulated the annealing conditions during head production where the first and second insulation layers (I1 and I2) and the second pole piece layer (P2) undergo baking steps at 232° C. for 400 minutes. In all the examples B/H graphs show easy axis and hard axis loops which indicate anisotropy field $H_K$, hard axis coercivity $H_{CH}$ and easy axis coercivity $H_{CE}$ for each of the ferromagnetic laminated layers under different process conditions.

EXAMPLE I

In Example I the ferromagnetic laminated layer 300 in FIG. 14 was formed on a wafer substrate 302 (208 in FIG. 12) under specified process conditions of the sputtering system 200 in FIG. 12. The target 204 was Fe—Al (2 at %) and the target 206 was alumina ($Al_2O_3$). By sequentially depositing from the alumina target 206 and the Fe—Al (2 at %) target 204 as the turntable 222 rotates, laminated layers can be formed as shown in FIG. 14. Processing conditions were 1750 watts (W) of radio frequency (RF) power at 13.56 MHz applied to the magnetron cathode 210, the sputtering chamber 202 was pressurized to $7.0 \times 10^{-3}$ mbar, the substrate bias was −25 volts and the percentage of nitrogen ($N_2$) in the argon and nitrogen process gas was 4%. After easy axis annealing the magnetic anisotropy $H_K$ was 4.9 Oe, the hard axis coercivity $H_{CH}$ was 0.05 Oe and the easy axis coercivity $H_{CE}$ was 0.64 Oe. The easy axis (ea) and the hard axis (ha) B/H loops of the ferromagnetic layer after the easy axis anneal is shown in FIG. 15. The tightness of the hard axis loop shows that the hard axis coercivity is very small so that a hard axis coercivity to easy axis coercivity ratio is very low, which is desirable for good magnetic properties of the ferromagnetic layer, with a high anisotropy $H_K$ of 4.9 Oe. A sister substrate piece from the same deposition was annealed along the hard axis of the ferromagnetic layers, which resulted in a magnetic anisotropy $H_K$ of 1.3 Oe, a hard axis coercivity $H_{CH}$ of 0.37 Oe and an easy axis coercivity $H_{CE}$ of 0.44 Oe. Comparing the magnetic properties after hard axis annealing with those after easy axis annealing it can be seen that the magnetic anisotropy $H_K$ significantly decreased from 4.9 to 1.3 Oe after the hard axis annealing and the hard axis coercivity $H_{CH}$ significantly increased from 0.05 to 0.37 Oe. After hard axis annealing the ferromagnetic layer is nearly isotropic since $H_{CH} \approx H_{CE}$ and $H_K$ is very low. This means that the magnetization of the ferromagnetic layer can be easily rotated in the direction of a small magnetic field. This is shown in the easy axis and hard axis loops of the B/H graph in FIG. 16 where the coercivities of the easy axis and hard axis loops approximate one another after the hard axis annealing.

EXAMPLE II

In Example II the ferromagnetic laminated layer 300 of FIG. 14 was formed in the sputtering system 200 in FIG. 12 with the same RF power and pressure of Example I, but with the substrate bias significantly lowered to −5 volts and the percentage of nitrogen in the nitrogen and argon mixture lowered to 2.0%. After easy axis annealing the anisotropy $H_K$ was 5.2 Oe, the hard axis coercivity $H_{CH}$ was 0.04 Oe and the easy axis coercivity $H_{CE}$ was 0.72 Oe. The easy axis and hard axis loops after the easy axis annealing are shown in FIG. 17. The laminated film demonstrates a highly desirable $H_K$ and a highly desirable $H_{CH}$ to $H_{CE}$ ratio of 0.06. As in Example I, a sister film from the same deposition was subjected to hard axis annealing after which the anisotropy $H_K$ was 4.4 Oe, the hard axis coercivity $H_{CH}$ was 0.13 Oe and the easy axis coercivity $H_{CE}$ was 0.67 Oe. The results are shown by the easy axis and hard axis loops in FIG. 18. Surprisingly, there was very little loss in the magnetic anisotropy $H_K$ and the ratio of $H_{CH}$ to $H_{CE}$ of 0.19 remained low. Accordingly, it can be seen that by lowering the substrate bias a significant difference is made in the properties of the ferromagnetic layer. This means that shield and pole piece layers formed according to these process conditions will be able to withstand hard axis annealing during the fabrication of the magnetic read and write head so as to more efficiently perform their functions.

In Examples III, IV and V a laminated ferromagnetic layer 400 has (18 Å alumina /1500 Å Fe—Zr (approx. 2 at %)-N)$_{2x}$/25 Å alumina=3061 Å. As shown in FIG. 19, the laminated ferromagnetic layer 400 has first and second ferromagnetic layers 402 and 404 and first, second and third alumina layers 406, 408 and 410 fabricated on the substrate 302 (208 in FIG. 12). In this instance the target 204 was Fe—Zr (2 at %) and the target 206 remained alumina. The RF power applied to the magnetron 210 (see FIG. 12) in each of Examples III, IV and V was the same as that employed for Examples I and II. As before, the ferromagnetic layers were annealed along their easy and hard axes in the same manner as for Examples I and II hereinabove.

EXAMPLE III

Figure 20:
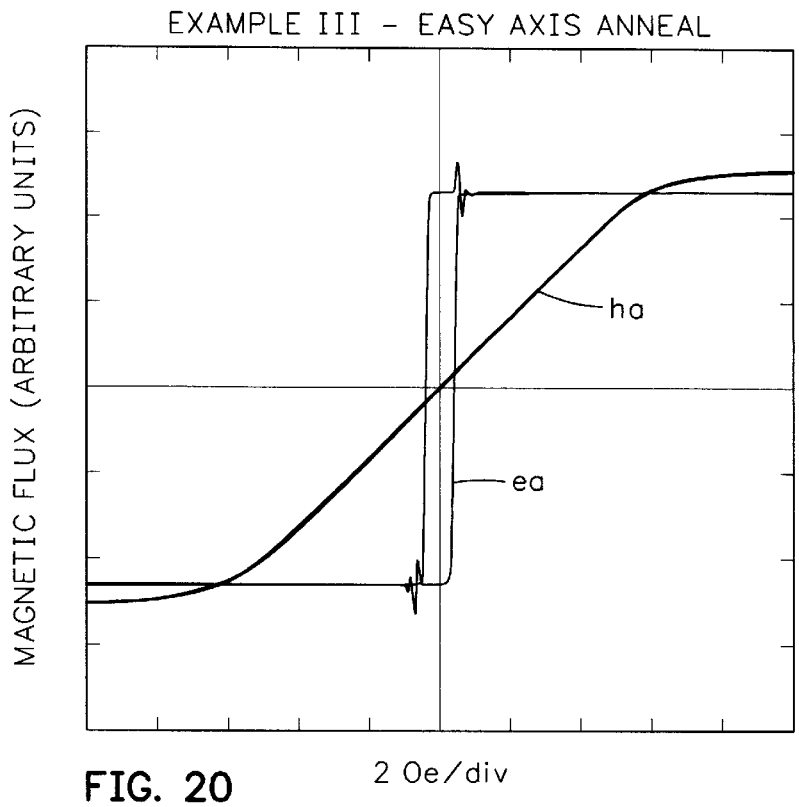
FIG. 20 is an B/H graph of Example III after easy axis annealing.
Figure 21:
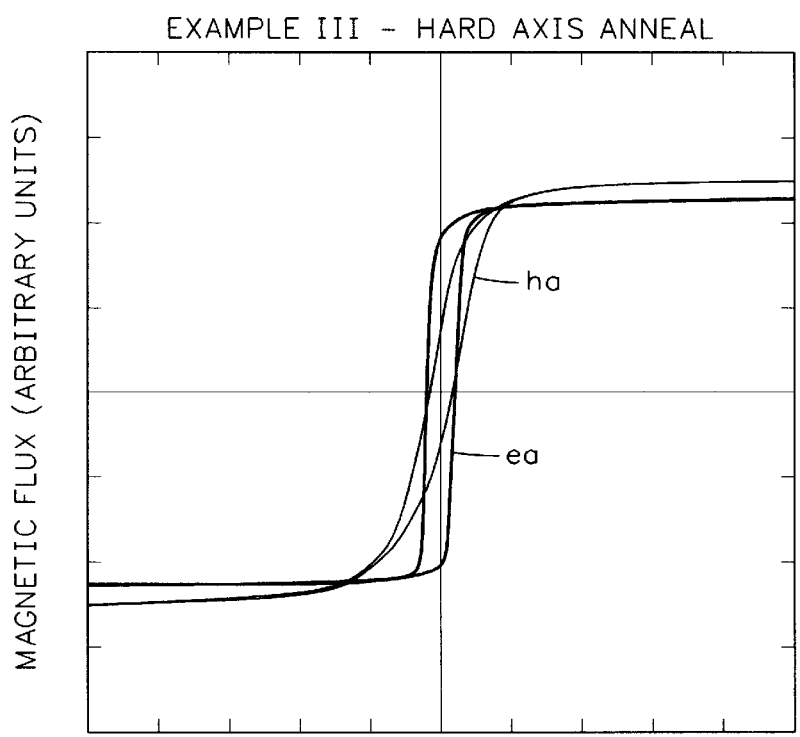
FIG. 21 is an B/H graph of Example III after hard axis annealing.

In this example the pressure supplied to the sputtering chamber 202 was $7.0 \times 10^{-3}$ mbar, the substrate bias applied to the substrate 208 was −25 volts and the percentage of nitrogen in the argon and nitrogen process gas in the chamber was 5%. After easy axis annealing the anisotropy $H_K$ was 6.1 Oe, the hard axis coercivity $H_{CH}$ was 0.03 Oe and the easy axis coercivity $H_{CE}$ was 0.45 Oe. These results are shown by the easy axis and hard axis loops in FIG. 20. After hard axis annealing on a sister sample the anisotropy $H_K$ was 1.2 Oe, the hard axis coercivity $H_{CH}$ was 0.28 Oe and the easy axis coercivity $H_{CE}$ was 0.31 Oe. The easy axis and hard axis loops after hard axis annealing are shown in FIG. 21. It can be seen after hard axis annealing that the coercivities of the easy axis and hard axis loops in FIG. 21 are close in value, which means that the ferromagnetic layer is nearly isotropic, and the orientation of its magnetization will be influenced by a weak magnetic field.

EXAMPLE IV

In Example IV the pressure in the sputtering chamber 202 in FIG. 12 was $13.0 \times 10^{-3}$ mbar, the substrate to the substrate 208 was −25 volts and the percentage of nitrogen in the nitrogen and argon mixture was 4%. After easy axis annealing the anisotropy $H_K$ was 6.2 Oe, the hard axis coercivity $H_{CH}$ was 0.01 Oe and the easy axis coercivity $H_{CE}$ was 0.39 Oe. The easy axis and hard axis loops after easy axis annealing are shown in FIG. 22. After hard axis annealing the anisotropy $H_K$ was −1.1 Oe, the hard axis coercivity $H_{CH}$ was 0.27 Oe and the easy axis coercivity $H_{CE}$ was 0.32 Oe. The anisotropy $H_K$ of −1.1 indicates that the easy axis of the ferromagnetic layer switched by 90° from its as deposited orientation to the original hard axis orientation, which is unacceptable for operation of the aforementioned ferromagnetic layers in the read write head. Further, the value of the hard axis coercivity $H_{CH}$ approximates the easy axis coercivity $H_{CE}$ which makes the ferromagnetic layer nearly isotropic. The easy axis and hard axis loops after hard axis annealing are shown in FIG. 23.

EXAMPLE V

In this example the layer 400 in FIG. 19 was formed on the wafer substrate 302 (208 in FIG. 12) with the pressure in the sputtering chamber 202 at $7.0 \times 10^{-3}$ mbar, the substrate bias to the wafer substrate 208 at −12 volts and the percentage of nitrogen in the nitrogen and argon mixture in the chamber at 4%. After an easy axis anneal of the laminated layer the anisotropy $H_K$ was 6.6 Oe, the hard axis coercivity $H_{CH}$ was 0.06 Oe and the easy axis coercivity $H_{CE}$ was 0.43 Oe. The easy and hard axis B/H loops after easy axis annealing are shown in FIG. 24. After subjecting the lamination on a sister substrate piece from the same deposition to the hard axis anneal the anisotropy $H_K$ was 2.6 Oe, the hard axis coercivity $H_{CH}$ was 0.10 Oe and the easy axis coercivity $H_{CE}$ was 0.36 Oe. While the anisotropy $H_K$ for hard axis annealing is 2.6 Oe compared to 6.6 Oe for easy axis annealing, the value of 2.6 Oe is satisfactory for operation of the ferromagnetic layers. Further, the hard axis coercivity $H_{CH}$ increased only slightly and the easy axis coercivity decreased slightly, which provided a desirable low ratio of hard axis coercivity $H_{CH}$ to easy axis coercivity $H_{CE}$ of 0.28. Accordingly, the process conditions in Example V are highly desirable for fabricating the aforementioned ferromagnetic layers of the read write head so that their magnetic properties will withstand hard axis annealing. The easy and hard axes loops after the hard axis anneal are shown in FIG. 25.

A summary of the process conditions and the results after easy and hard axis anneals for Examples I–V are shown in Chart B hereinbelow.

CHART B

| Power (W) | Pressure (× 10⁻³ mbar) | Substrate Bias (V) | % N₂/Ar | Easy Axis Anneal | | | | Hard Axis Anneal | | | |
| --- | --- | --- | --- | --- | --- | --- | --- | --- | --- | --- | --- |
| | | | | $H_k$(Oe) | $H_{ch}$(Oe) | $H_{ce}$(Oe) | $H_{ch}/H_{ce}$ | $H_k$(Oe) | $H_{ch}$(Oe) | $H_{ce}$(Oe) | $H_{ch}/H_{ce}$ |
| 1750 | 7.0 | −25 | 4.0 | 4.9 | 0.05 | 0.64 | 0.08 | 1.3 | 0.37 | 0.44 | 0.84 |
| 1750 | 7.0 | −5 | 2.0 | 5.2 | 0.04 | 0.72 | 0.06 | 4.4 | 0.13 | 0.67 | 0.19 |
| 1750 | 7.0 | −25 | 5.0 | 6.1 | 0.03 | 0.45 | 0.07 | 1.2 | 0.28 | 0.31 | 0.90 |
| 1750 | 13.0 | −25 | 4.0 | 6.2 | 0.01 | 0.39 | 0.03 | −1.1 | 0.27 | 0.32 | 0.84 |
| 1750 | 7.0 | −12 | 4.0 | 6.6 | 0.06 | 0.43 | 0.14 | 2.6 | 0.10 | 0.36 | 0.28 |

Figure 26:
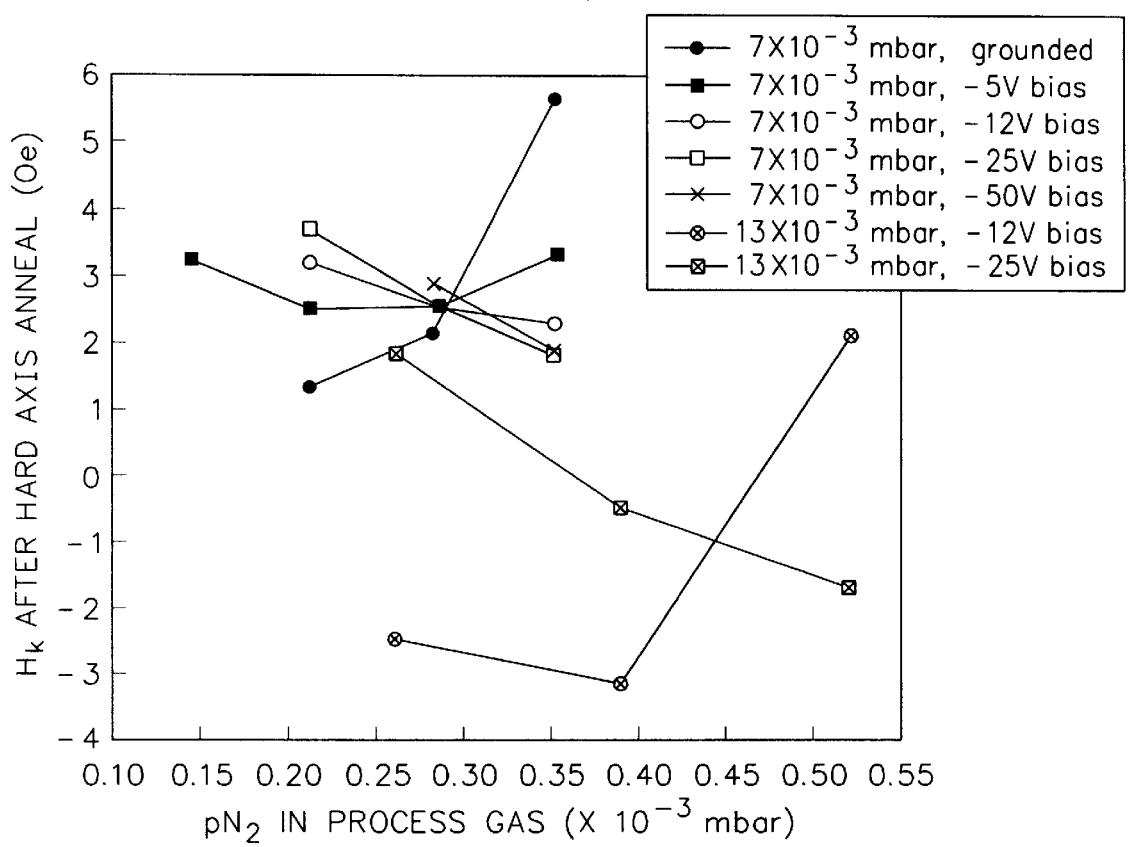
FIG. 26 is a graph of the effect of the partial pressure of nitrogen ($N_2$) on the magnetic anisotropy of a laminated layer after hard axis annealing.

FIG. 26 is a chart showing anisotropy $H_K$ versus partial pressure of nitrogen in a nitrogen and argon process gas mixture after three hard axis anneals of the lamination 400 shown in FIG. 19 at 232° C. for 400 minutes under seven different process conditions. The RF power to the magnetron cathode was 1750 watts for each of the seven process conditions. In the first five process conditions the pressure in the sputtering chamber was $7 \times 10^{-3}$ mbar and in the last two process conditions the pressure in the sputtering chamber was $13 \times 10^{-3}$ mbar. In the first condition where the wafer substrate was grounded the anisotropy $H_K$ significantly increased with an increase in the partial pressure of the nitrogen. When −5 volts bias was applied to the wafer substrate the anisotropy $H_K$ first decreases and then increases with an increase in the partial pressure of the nitrogen. When the substrate bias was −12 volts the anisotropy $H_K$ decreased with an increase in the partial pressure of nitrogen. When the substrate bias was −25 volts the anisotropy $H_K$ decreased more significantly with an increase in the partial pressure of nitrogen. When the substrate bias was −50 volts a significant decrease was noted in the anisotropy $H_K$ with an increase in the partial pressure of nitrogen. When the substrate bias was −12 volts with a chamber pressure of $13 \times 10^{-3}$ mbar the anisotropy $H_K$ decreased slightly with an increase in the partial pressure of nitrogen and then increased with an increase in the partial pressure of nitrogen, going from negative to positive. The negative values of $H_K$ indicate that the easy axis switched 90° during annealing from the original easy axis orientation to the original hard axis orientation. When the substrate bias was −25 volts the anisotropy $H_K$ decreased significantly with an increase in the partial pressure of nitrogen, going from positive to negative. It can be seen from this chart that the preferred process condition to obtain a large value of $H_K$ is a grounded wafer substrate with a chamber pressure at $7 \times 10^{-3}$ mbar and the partial pressure of nitrogen being $0.35 \times 10^{-3}$ mbar. The second process condition at $7 \times 10^{-3}$ mbar and −5 volts bias has a preferred partial pressure of nitrogen of $0.15 \times 10^{-3}$ mbar. The third process condition at $7 \times 10^{31\ 3}$ mbar and −12 volt bias has a preferred partial pressure of $0.20 \times 10^{-3}$ mbar.

Figure 27:
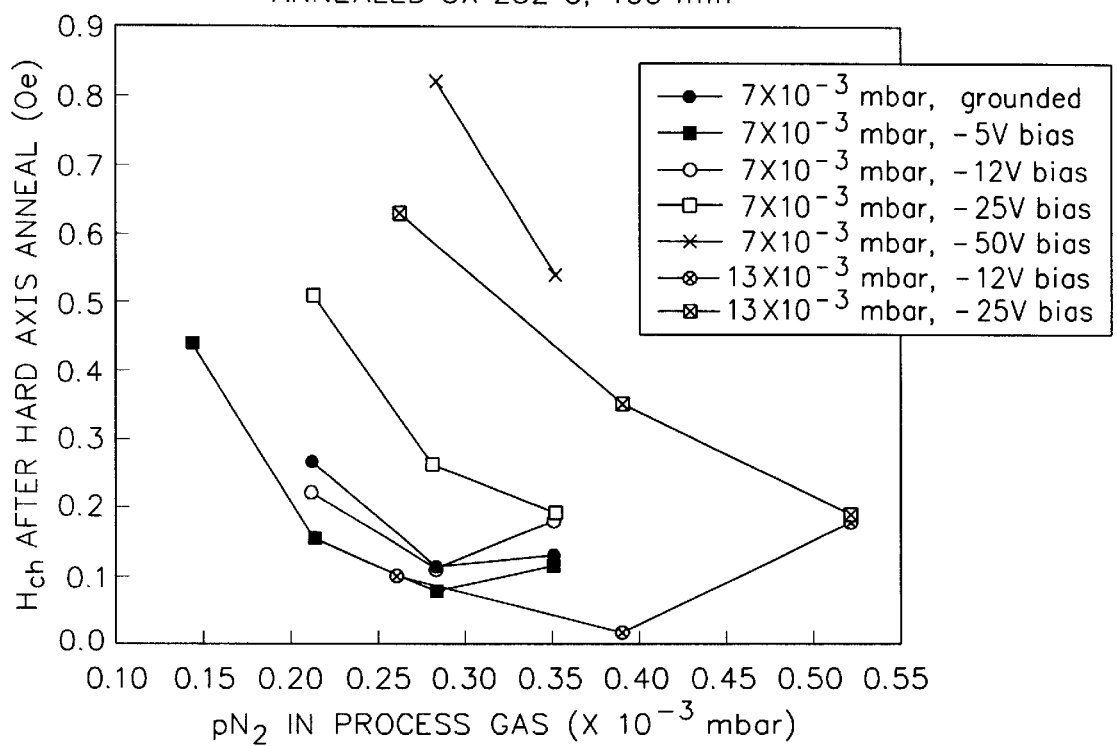
FIG. 27 is a graph of the effect of the partial pressure of nitrogen ($N_2$) on the hard axis coercivity of a laminated layer after hard axis annealing.

For the same process conditions for the same laminated layer 400 in FIG. 19, FIG. 27 shows the hard axis coercivity $H_{CH}$ versus partial pressure of the nitrogen in the process gas after the same three anneals along the hard axis. With the wafer substrate grounded it can be seen that the hard axis coercivity $H_{CH}$ was quite low when the partial pressure of the nitrogen was between $0.28 \times 10^{-3}$ mbar and $0.35 \times 10^{-3}$ mbar. With a partial pressure of $0.35 \times 10^{-3}$ mbar FIG. 26 shows a very high anisotropy $H_K$ of 5.8 Oe. Accordingly, with a grounded wafer substrate a chamber pressure of $7 \times 10^{-3}$ mbar, and the partial pressure of nitrogen at $0.35 \times 10^{-3}$ mbar, a highly thermally stable ferromagnetic layer can be constructed. When the substrate bias in FIG. 27 is −5 volts, the hard axis coercivity $H_{CH}$ is quite low when the partial pressure of nitrogen in the process gas is between $0.22 \times 10^{-3}$ mbar and $0.35 \times 10^{-3}$ mbar. When the substrate bias is −12 volts, the hard axis coercivity $H_{CH}$ is quite low when the partial pressure of nitrogen is $0.28 \times 10^{-3}$ mbar. While the hard axis coercivity $H_{CH}$ in FIG. 27 decreased for an increase in the partial pressure of nitrogen at −25 volts, the anisotropy $H_K$ in FIG. 26 also decreased making this process condition undesirable. With a substrate bias of −50 volts the hard axis coercivity $H_{CH}$ starts off very high and still remains high after a substantial decrease making this process condition undesirable. With a substrate bias of −12 volts and a chamber pressure of $13 \times 10^{-3}$ mbar the hard axis coercivity $H_{CH}$ in FIG. 27 remained low as the partial pressure of nitrogen changed. However, the anisotropy $H_K$ showed an erratic behavior in FIG. 26. With a substrate bias at −25 volts and the chamber pressure at $13 \times 10^{-3}$ mbar the coercivity $H_{CH}$ in FIG. 23 significantly decreased with an increase in partial pressure of nitrogen. However, the anisotropy $H_K$ in FIG. 26 also significantly decreased and became negative with an increase in the partial pressure of nitrogen rendering this condition unsatisfactory.

Discussion

The process conditions in Examples II and V apply to an iron nitride (Fe—N) based layer and, more particularly, to Fe—M—N where M is selected from a group comprising Al, Zr, Ti, Hf, Nb, Ta, B and Si. Of this group Al and Zr are preferred with Al being the most preferred M for the alloy.

From the above discussion it can be seen that the factors that favor anisotropy retention after hard axis annealing are: (1) low substrate bias or a grounded substrate table: relatively low film bombardment by Ar ions during deposition; (2) optimized sputtering pressure: at high pressure the films are prone to easy axis switching, and at low pressure, the hard and easy axis coercivities increase; (3) optimized percentage of nitrogen in the nitrogen and argon process gas: if there is too little nitrogen in the process gas, the coercivity of the films increases, and if the nitrogen is too high, the films become susceptible to easy axis switching and/or the coercivity increases; (4) Fe—M—N layer thicknesses in an optimal range between approximately 800 Å and 3000 Å: thinner layers are more susceptible to anisotropy loss, but thicker layers have higher coercivities; (5) optimized annealing temperature: if the temperature is too low, the best soft magnetic properties do not develop in either hard or easy axis annealing, and too high a temperature destroys the anisotropy. The particular optimization depends on the identity of M and its concentration in the film.

In the preferred embodiment the turntable 222 in FIG. 12 is continuously rotated during sputter deposition. It should be understood, however, that the present invention also includes stopping the substrate below the target during sputter deposition which is known in the art as static deposition.

To recap the preferred process conditions, the substrate bias is preferably between 0 to −15 volts; the chamber pressure is between $4.0 \times 10^{-3}$ and $8.0 \times 10^{-3}$ mbar; the RF target power is 1000 to 3000 watts for a 200 mm diameter target, which power range scales with target size in a particular deposition system; the partial pressure of nitrogen is from $0.10 \times 10^{-3}$ to $0.40 \times 10^{-3}$ mbar with a target power of 1750 watts, which range depends upon the alloy additive (M), target power, and sputtering system layout; and the thickness of the individual iron nitride (Fe—N) layers is from 800 to 3000 Å. This is the range of thicknesses of the various iron nitride (Fe—N) layers in laminations such as that shown in FIGS. 14 and 19. Laminated layers are preferred over thicker individual layers. The hard axis annealing can be at a temperature between 180° C. to 260° C. in the presence of a magnetic field of approximately 1000 Oe directed along the hard axis of the ferromagnetic layers. The sputtering system can be an RF magnetron sputtering system or a pulsed DC magnetron system which have in common that the power to the magnetron has radio frequency components. In a broad aspect of the present invention the process conditions are adjusted for employing the present method in either of these sputtering systems so that the anisotropy $H_K$ of the final ferromagnetic layer is not less than 2.0 Oe after hard axis annealing. In a more narrow concept the process conditions are adjusted so that the anisotropy is not less than 2.0 Oe and the hard axis to easy axis ratio $H_{CH}/H_{CE}$ is less than 0.60. The invention also includes the ferromagnetic layer per se since it has a unique microstructure as a result of its fabrication which results in it maintaining an anisotropy $H_K$ of at least 2.0 Oe and a ratio $H_{CH}/H_{CE}$ of less than or equal to 0.60. In any process condition it is important that the easy axis of the ferromagnetic layer be maintained in its as deposited direction and not be switched 90° to the hard axis direction during hard axis annealing.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

I claim:

1. A magnetic read write head having an air bearing surface (ABS) comprising:
    a spin valve sensor, nonmagnetic first and second read gap layers, a ferromagnetic first shield layer and a ferromagnetic first pole piece layer;
    the spin valve sensor being located between the first and second read gap layers and the first and second read gap layers being located between the first shield layer and the first pole piece layer;
    the spin valve sensor having a pinned layer which has a magnetic moment that is pinned by a pinning layer in a direction perpendicular to the ABS;
    a ferromagnetic second pole piece layer and a nonmagnetic write gap layer wherein the second pole piece layer is separated from the first pole piece layer by the write gap layer at the ABS and is connected to the first pole piece layer at a back gap;
    each of the first shield layer and the first and second pole piece layers having a magnetic easy axis that is directed parallel to the ABS and parallel to major thin film planes of the layers;
    an insulation stack with a coil layer embedded therein located between the first and second pole piece layers wherein the insulation stack includes at least one baked photoresist insulation layer that has been formed in part by heating at a preselected annealing temperature which is sufficient to hard bake said photoresist insulation layer in the presence of a magnetic field that is directed perpendicular to said ABS wherein said heating and magnetic field constitute hard axis annealing of the first shield layer and the first pole piece layer; and
    after said hard axis annealing said at least first pole piece layer having a magnetic anisotropy of at least 2.6 Oe and a hard axis to easy axis coercivity ratio of less than or equal to 0.60.

2. The magnetic read head as claimed in claim 1 wherein each of said ferromagnetic layers is Fe—M—N where M is selected from the group comprising Al, Zr, Ti, Hf, Nb, Ta, B and Si.

3. The magnetic read head as claimed in claim 2 wherein M is Al or Zr.

4. The magnetic read head as claimed in claim 3 further comprising:
    the heating and magnetic field of the hard axis annealing being 232° C. and 1,000 Oe respectively; and
    a duration of the hard axis annealing being 400 minutes.

5. The magnetic read head as claimed in claim 4 wherein said at least first pole piece layer is a lamination of Fe—M—N and alumina layers.

6. The magnetic read head as claimed in claim 5 wherein each ferromagnetic layer is formed with a magnetic anisotropy between 2.0 to 4.4 Oe and with a hard axis to easy axis coercivity ratio from 0.19 to 0.28.

7. The magnetic read head as claimed in claim 1 wherein the first pole piece layer is FeAlN.

8. The magnetic read head as claimed in claim 7 further comprising:
    the heating and magnetic field of the hard axis annealing being 232° C. and 1,000 Oe respectively; and
    a duration of the hard axis annealing being 400 minutes.

9. The magnetic read head as claimed in claim 8 wherein said at least first pole piece layer is a lamination of FeAlN and alumina layers.

10. The magnetic read head as claimed in claim 9 wherein the magnetic anisotropy is substantially 4.4 Oe and the hard axis to easy axis coercivity is substantially .19.

11. A magnetic disk drive including a read write magnetic head having an air bearing surface (ABS), the disk drive comprising:
    the magnetic head including:
        a spin valve sensor, first and second nonmagnetic first and second read gap layers, a ferromagnetic first shield layer and a ferromagnetic first pole piece layer;
        the spin valve sensor being located between the first and second read gap layers and the first and second read gap layers being located between the first shield layer and the first pole piece layer;
        the spin valve sensor having a pinned layer which has a magnetic moment that is pinned by a pinning layer in a direction perpendicular to the ABS;
        a ferromagnetic second pole piece layer and a write gap layer wherein the second pole piece layer is separated from the first pole piece layer by the write gap layer at the ABS and is connected to the first pole piece layer at a back gap;
        each of the first shield layer and the first and second pole piece layers having an easy axis that is directed parallel to the ABS;
        an insulation stack with a coil layer embedded therein located between the first and second pole piece layers wherein the insulation stack includes at least one baked photoresist insulation layer that has been formed in part by heating at a preselected annealing temperature which is sufficient to hard bake said photoresist insulation layer in the presence of a magnetic field that is directed perpendicular to said ABS wherein said heating and magnetic field constitute hard axis annealing of the first shield layer and the first pole piece layer; and
        after said hard axis annealing said at least first pole piece layer having a magnetic anisotropy of at least 2.6 Oe and a hard axis to easy axis coercivity ratio of less than or equal to 0.60;
    a housing;
    a magnetic disk rotatably supported in the housing;
    a support mounted in the housing for supporting the magnetic head with its ABS site facing the magnetic disk so that the magnetic head is in a transducing relationship with the magnetic disk;
    spindle motor for rotating the magnetic disk;
    an actuator means connected to the support for moving the magnetic head to multiple positions with respect to said magnetic disk; and
    a processor connected to the magnetic head, to the spindle motor and to the actuator for exchanging signals with the magnetic head, for controlling movement of the magnetic disk and for controlling the position of the magnetic head.

12. The magnetic disk drive as claimed in claim 11 wherein each of said ferromagnetic layers is Fe—M—N where M is selected from the group comprising Al, Zr, Ti, Hf, Nb, Ta, B and Si.

13. The magnetic disk drive as claimed in claim 12 wherein M is Al or Zr.

14. The magnetic disk drive as claimed in claim 13 further comprising:

the heating and magnetic field of the hard axis annealing being 232° C. and 1,000 Oe respectively; and a duration of the hard axis annealing being 400 minutes.

15. The magnetic disk drive as claimed in claim 14 wherein said at least first pole piece layer is a lamination of Fe—M—N and alumina layers.

16. The magnetic disk drive as claimed in claim 15 wherein the magnetic anisotropy is substantially 4.4 Oe and the hard axis to easy axis coercivity is substantially .19.

17. The magnetic disk drive as claimed in claim 11 wherein the first pole piece layer is FeAlN.

18. The magnetic disk drive as claimed in claim 17 further comprising:

the heating and magnetic field of the hard axis annealing being 232° C. and 1,000 Oe respectively; and a duration of the hard axis annealing being 400 minutes.

19. The magnetic disk drive as claimed in claim 18 wherein said at least first pole piece layer is a lamination of FeAlN and alumina layers.

20. The magnetic disk drive as claimed in claim 19 wherein the magnetic anisotropy is substantially 4.4 Oe and the hard axis to easy axis coercivity is substantially .19.

\* \* \* \* \*